(12) United States Patent
Tsurume et al.

(10) Patent No.: US 7,723,842 B2
(45) Date of Patent: May 25, 2010

(54) INTEGRATED CIRCUIT DEVICE

(75) Inventors: Takuya Tsurume, Atsugi (JP); Naoto Kusumoto, Isehara (JP)

(73) Assignee: Semiconductor Energy Laboratory Co., Ltd, Atsugi-shi, Kanagawa-ken (JP)

( * ) Notice: Subject to any disclaimer, the term of this patent is extended or adjusted under 35 U.S.C. 154(b) by 133 days.

(21) Appl. No.: 11/504,664

(22) Filed: Aug. 16, 2006

(65) Prior Publication Data
US 2007/0052088 A1 Mar. 8, 2007

(30) Foreign Application Priority Data
Sep. 2, 2005 (JP) ............... 2005-254481

(51) Int. Cl.
*H01L 23/34* (2006.01)
*H01L 21/00* (2006.01)

(52) U.S. Cl. ............... 257/707; 257/706; 257/E23.101

(58) Field of Classification Search ................ 257/686, 257/706, 712, 713, 697, 723, 717, 796; 438/122
See application file for complete search history.

(56) References Cited

U.S. PATENT DOCUMENTS

| | | | |
|---|---|---|---|
| 6,235,624 B1 | 5/2001 | Sasaki et al. | |
| 6,646,711 B2 | 11/2003 | Sugano | |
| 6,682,963 B2 | 1/2004 | Ishikawa | |
| 7,091,061 B2 * | 8/2006 | King et al. | 438/107 |
| 7,109,071 B2 | 9/2006 | Ishikawa | |
| 2002/0030189 A1 | 3/2002 | Ishikawa | |
| 2004/0087110 A1 | 5/2004 | Takayama et al. | |
| 2004/0147113 A1 * | 7/2004 | Yamazaki et al. | 438/660 |
| 2004/0147133 A1 * | 7/2004 | Lee et al. | 438/721 |
| 2004/0212012 A1 | 10/2004 | Yamazaki et al. | |
| 2004/0262767 A1 | 12/2004 | Matsuo | |
| 2005/0023525 A1 | 2/2005 | Ishikawa | |
| 2005/0045891 A1 | 3/2005 | Yamazaki et al. | |
| 2005/0067713 A1 | 3/2005 | Mutta et al. | |
| 2005/0067716 A1 * | 3/2005 | Mishra et al. | 257/778 |
| 2006/0039118 A1 * | 2/2006 | Jafari et al. | 361/719 |
| 2006/0169787 A1 * | 8/2006 | Gelbman | 235/492 |
| 2006/0223301 A1 | 10/2006 | Vanhaelemeersch et al. | |
| 2007/0023758 A1 | 2/2007 | Tsurume et al. | |

FOREIGN PATENT DOCUMENTS

| | | |
|---|---|---|
| JP | 06-045485 | 2/1994 |
| JP | 08-097330 | 4/1996 |
| JP | 08-222668 | 8/1996 |
| JP | 2002-087844 | 3/2002 |
| JP | 2006-073744 | 3/2006 |

* cited by examiner

*Primary Examiner*—Leonardo Andújar
*Assistant Examiner*—William Harriston
(74) *Attorney, Agent, or Firm*—Eric J. Robinson; Robinson Intellectual Property Law Office, P.C.

(57) ABSTRACT

To solve the problems caused by accumulation of heat generated from an integrated circuit. The integrated circuit device of the invention includes a substrate over one surface of which an integrated circuit is formed. The other surface of the substrate (a surface over which the integrated circuit is not formed) includes a depressed portion and has a larger surface area than the one surface. The depressed portion formed on the other surface of the substrate is filled with a heat sink material, or a film containing a heat sink material is formed at least over the surface of the depressed portion. Such integrated circuit devices may be provided in a multilayer structure.

19 Claims, 29 Drawing Sheets a  101A  b

102

102
103A 102
104

102
101B
103B

321

301B  320B

421

401B  420B

UV UV UV UV UV UV

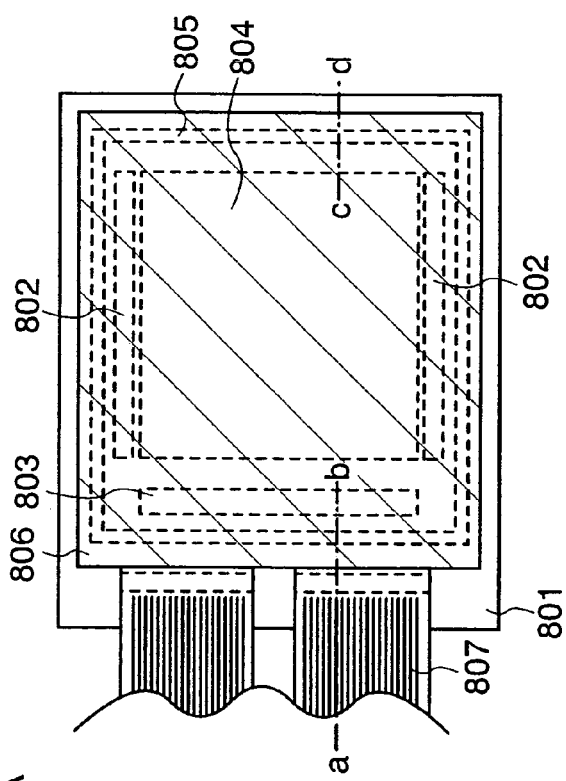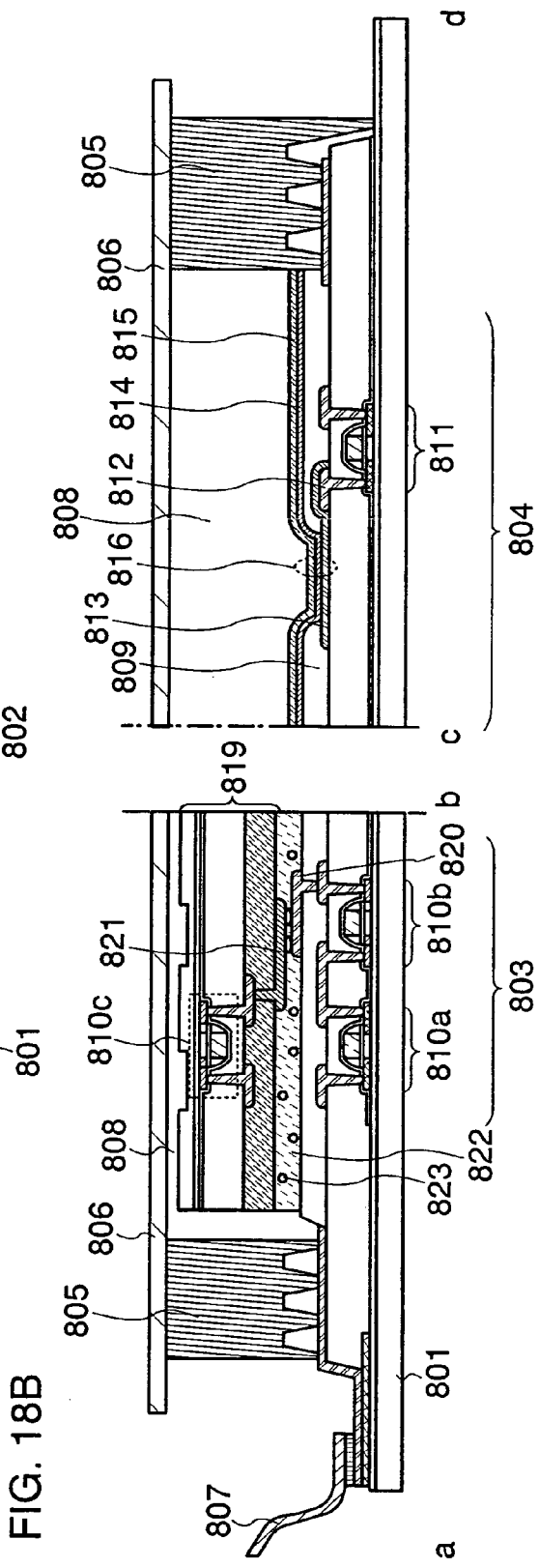
FIG. 18A
FIG. 18B

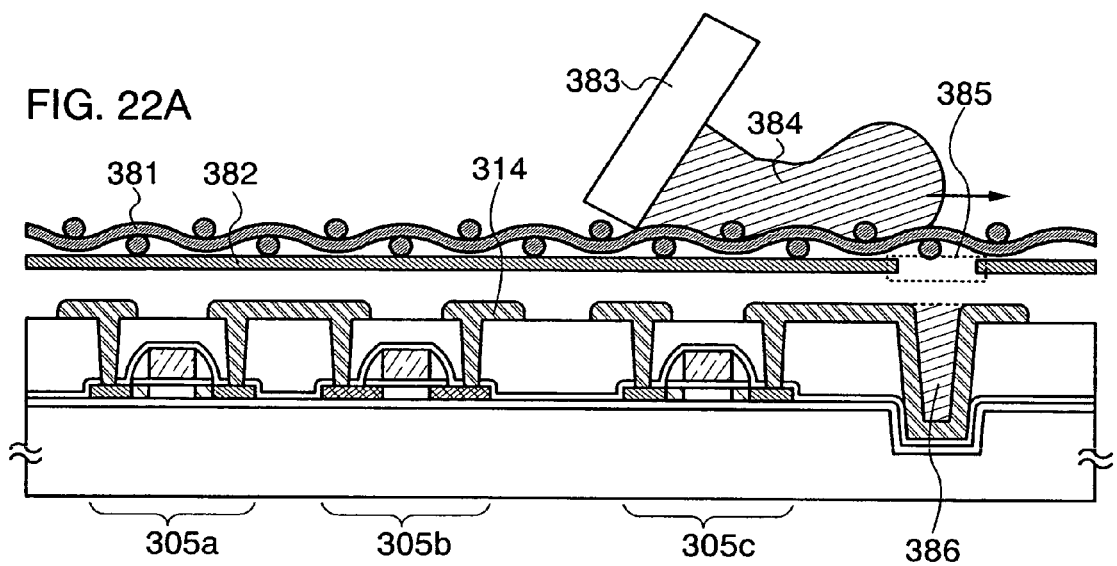
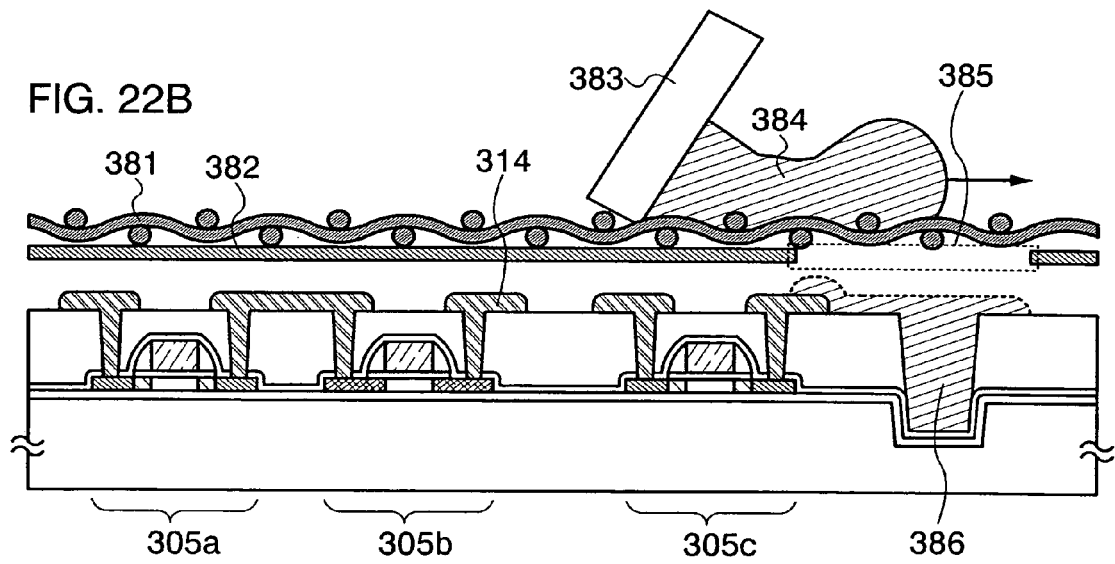

INTEGRATED CIRCUIT DEVICE

BACKGROUND OF THE INVENTION

1. Field of the Invention

The present invention relates to an integrated circuit device.

2. Description of the Related Art

In recent years, the development of an integrated circuit device transmitting and receiving data in a non-contact manner (also called an RFID (Radio Frequency Identification) tag, an ID tag, an IC tag, an IC chip, an RF (Radio Frequency) tag, a wireless tag, an electronic tag, or a wireless chip) has been actively advanced. The integrated circuit device has been developed for the purpose of various applications as well as transmission and reception of data in a non-contact manner. In such an integrated circuit device, reduction in film thickness, miniaturization, and the like are required.

The thickness of a substrate is reduced by, for example, grinding or polishing the substrate, etching the substrate utilizing chemical reaction, or the like (for example, see Patent Document 1). Further, in order to integrate semiconductor elements, integrated circuit devices manufactured in this manner are provided in a multilayer structure (provided to be stacked).

[Patent Document 1] Japanese Patent Application Laid-Open No. 2002-87844

SUMMARY OF THE INVENTION

In an integrated circuit device, various problems are caused by accumulation of heat that is generated from an integrated circuit included in the integrated circuit device. These problems become more serious if integrated circuit devices are provided in a multilayer structure. It is an object of the invention to solve the problems caused by accumulation of heat generated from an integrated circuit.

An integrated circuit device of the invention includes a substrate over one surface of which an integrated circuit is formed. A depressed portion is formed on the other surface of the substrate (a surface over which an integrated circuit is not formed), and the other surface has a larger surface area than the one surface. The depressed portion formed on the other surface is filled with a heat sink material.

The depressed portion is not necessarily filled with a heat sink material, and a film containing a heat sink material may be formed at least over a surface of the depressed portion. Since the film containing a heat sink material may be formed at least over the surface of the depressed portion, it thus may also be formed in portions other than the depressed portion, for example, over the whole surface of the other surface of the substrate.

In this specification, a heat sink material means a material with higher thermal conductivity than a material used for a substrate over which an integrated circuit is formed.

According to such a structure, heat generated from the integrated circuit included in the integrated circuit device can be effectively dissipated.

In addition, the aforementioned integrated circuit device may be provided in a multilayer structure (a plurality of the aforementioned integrated circuits may be stacked).

When the integrated circuit devices are provided in a multilayer structure, adjacent integrated circuit devices may or may not be electrically connected to each other.

In the integrated circuit device of the invention, a depressed portion is formed on a surface of a substrate, over which an integrated circuit is not formed. Accordingly, the surface has a larger surface area than the other surface of the substrate. Further, the depressed portion is filled with a heat sink material, or a film containing a heat sink material is formed at least over a surface of the depressed portion. Thus, since the surface over which the integrated circuit is not formed has a larger surface area and higher heat dissipation properties due to the heat sink material, heat generated from the integrated circuit can be effectively dissipated.

In particular, when the integrated circuit devices are provided in a multilayer structure, problems caused by accumulation of heat generated from the integrated circuit become more serious. In such a case also, the aforementioned structure allows heat generated from the integrated circuit to be effectively dissipated. Therefore, the aforementioned structure has a significant effect particularly when the integrated circuits are provided in a multilayer structure.

BRIEF DESCRIPTION OF DRAWINGS

FIGS. 18A and 18B are cross sectional views showing Embodiment 2;

FIGS. 22A and 22B show a case of forming a conductive material by screen printing;

DETAILED DESCRIPTION OF THE INVENTION

Embodiment Modes of the invention are described below.

Embodiment Mode 1

An example of a manufacturing method of this embodiment mode is described with reference to FIGS. 1A to 3C.

Figure 1A:
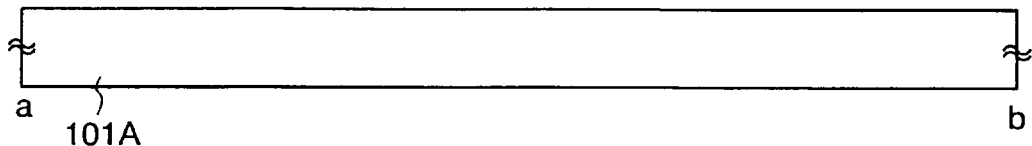
FIGS. 1A to 1E are cross sectional views showing Embodiment Mode 1.

First, a substrate 101A is prepared as shown in FIG. 1A. The substrate 101A may be a glass substrate, a quartz substrate, a metal substrate (such as a ceramic substrate and a stainless steel substrate), or the like. A semiconductor substrate such as a Si substrate may also be used. Alternatively, a flexible substrate such as a resin substrate (plastic substrate) may be used, which is typified by polyethylene terephthalate (PET), polyethylene naphthalate (PEN), polyether sulfone (PES), acrylic, or the like. A surface of the substrate may be smoothed in advance by polishing.

Figure 1B:
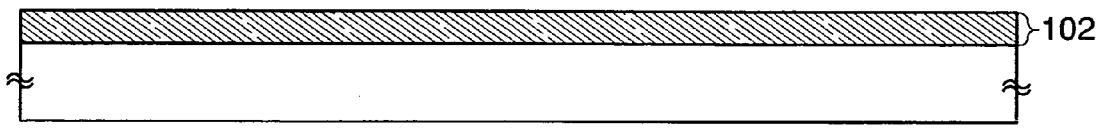

Then, a layer 102 including an integrated circuit is formed over a surface of the substrate 101A as shown in FIG. 1B.

Figure 1C:
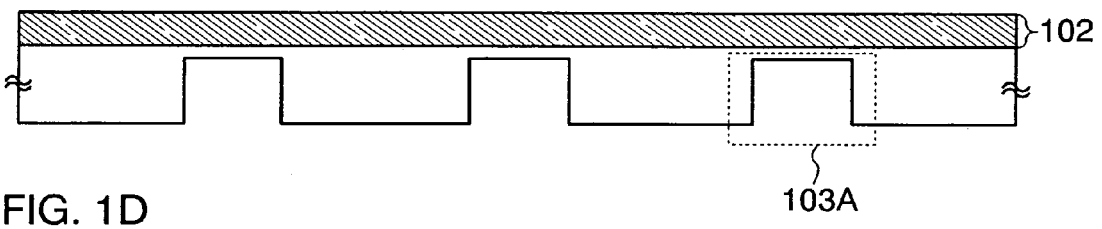

As shown in FIG. 1C, a groove 103A as a depressed portion is formed on a surface of the substrate 101A, over which the layer 102 including an integrated circuit is not formed (hereinafter referred to as the other surface of the substrate 101A). The groove 103A may be formed by etching or laser processing. Alternatively, the groove 103A may be formed by mechanically grinding. Further, a plastic substrate, only one surface of which has depressed and projecting portions formed in advance, may also be used as the substrate 101A.

Although the cross section of the groove 103A has a rectangular shape in FIG. 1C, it is not particularly limited to this shape. The cross section of the groove 103A may have a U shape or a wedge shape, or a side surface of the groove 103A may have a tapered shape.

Figure 1D:
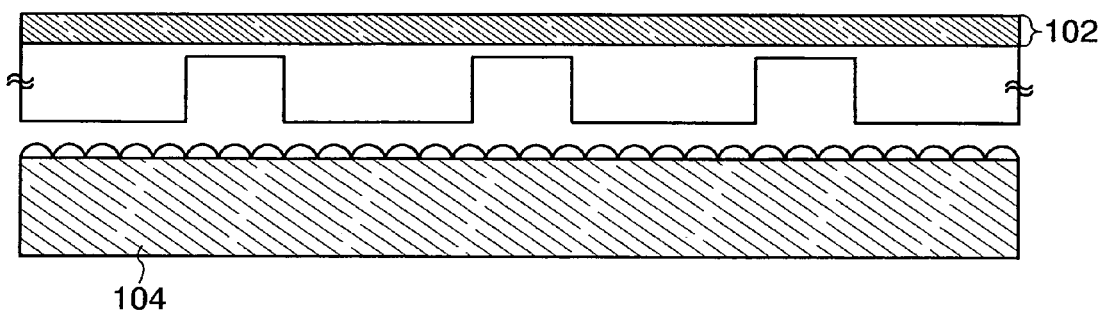

Then, as shown in FIG. 1D, the other surface of the substrate 101A is subjected to a treatment for reducing the thickness of the substrate 101A (thinning treatment) using a grinding or polishing means 104. For example, the substrate 101A is ground by the grinding means so as to have a thickness of 100 µm or less, and then polished by the polishing means so as to have a thickness of 20 µm or less. When the ground surface of the substrate 101A is further polished in this manner, the other surface of the substrate 101A can be smoothed. Described here is the example of performing the thinning treatment by grinding and then polishing; however, the invention is not limited to this, and only the grinding treatment may be performed using the grinding means, or only the polishing treatment may be performed using the polishing means.

In addition, although the thinning treatment of the substrate 101A is performed by the grinding means or the polishing means, the invention is not limited to this, and the thinning treatment of the substrate 101A may be performed by etching using a chemical treatment. If a glass substrate is used as the substrate 101A, chemical etching can be performed using a drug solution containing hydrofluoric acid.

In addition, the thinning treatment of the substrate 101A may be performed by combining the grinding treatment, the polishing treatment, and the etching treatment. For example, the thinning treatment of the substrate 101A may be achieved by performing the chemical etching after one or both of the grinding treatment and the polishing treatment, or may be achieved by performing one or both of the grinding treatment and the polishing treatment after the etching treatment.

The grinding treatment is a treatment for grinding and smoothing a surface of an object to be treated (here, the other surface of the substrate 101A) using grains of a grinding stone or the like as a grinding means. The polishing treatment is a treatment for smoothing a surface of an object to be treated by a plastic smoothing action or a frictional polishing action using an abrasive agent such as abrasive cloth and paper and abrasive grains. The chemical treatment is a treatment for applying chemical etching to an object to be treated using an agent. Note that as the polishing treatment, CMP (Chemical Mechanical Polishing) may also be used.

Figure 1E:
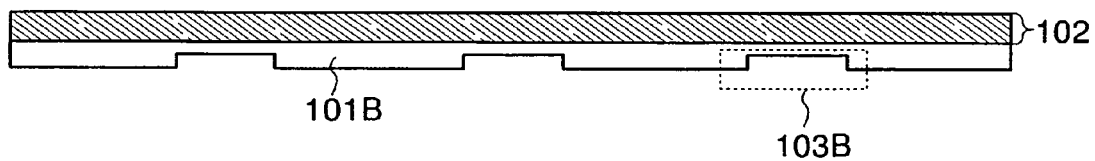

FIG. 1E shows a state in which the thinning treatment of the substrate 101A is completed. Through the thinning treatment, the thickness of the substrate is reduced to be a substrate 101B, and the depth of the groove 103A that is formed on the other surface of the substrate is reduced to be a groove 103B.

Although the cross section of the groove 103B after the thinning treatment of the substrate has a rectangular shape in FIG. 1E, it is not particularly limited to this shape. Similarly to the cross section of the groove 103A before the thinning treatment of the substrate, the cross section of the groove 103B may have a U shape or a wedge shape, or a side surface of the groove 103B may have a tapered shape.

The thickness of the substrate 101B after the thinning treatment is 100 µm or less, preferably 50 µm or less, and more preferably 30 µm or less. When the thickness of the substrate 101B is 100 µm or less, the substrate 101B has flexibility; therefore, a flexible integrated circuit device can be obtained finally. In addition, since the substrate 101B functions as a protective film to maintain the durability of the integrated circuit device and to prevent impurity elements, moisture, and the like from entering the elements of the integrated circuit, the thickness of the substrate 101B is 1 µm or more, preferably 2 µm or more, and more preferably 4 µm or more.

Figure 2A:
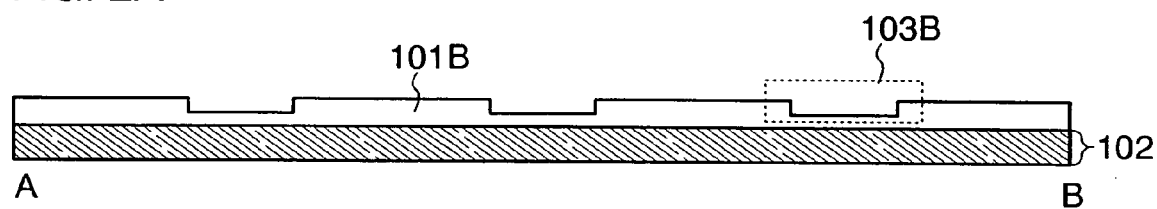
FIG. 2A is a cross sectional view and FIG. 2B is a perspective view showing Embodiment Mode 1.
Figure 2B:
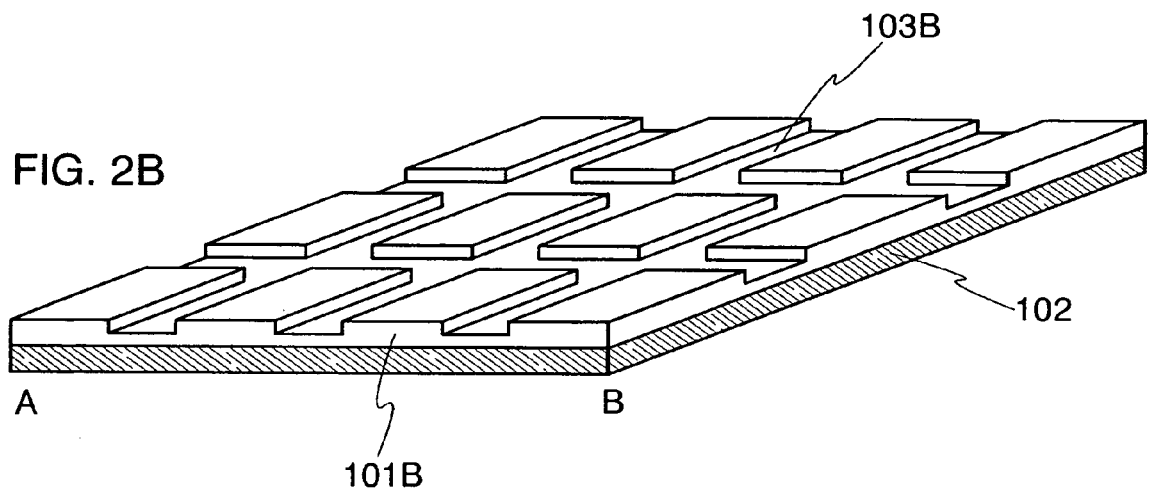

FIG. 2B is a perspective view of the integrated circuit device manufactured in the aforementioned manner. FIG. 2A is a cross sectional view along a line A-B of FIG. 2B. FIG. 2B is a perspective view seen from above the substrate 101B with the groove 103B facing up.

In FIGS. 2A and 2B, the groove 103B as a depressed portion is formed on the surface of the substrate 101B, over which the layer 102 including the integrated circuit is not formed (hereinafter referred to as the other surface of the substrate 101B). FIGS. 2A and 2B show grooves that are formed in the longitudinal direction and grooves that are formed in the lateral direction so as to be perpendicular to the grooves formed in the longitudinal direction. Note that the shape of the groove 103B shown in FIGS. 2A and 2B is just an example, and the invention is not limited to this shape. The groove 103B may have any shape as long as it is formed on a surface over which the integrated circuit is not formed. Accordingly, for example, grooves may be formed in parallel only in the longitudinal direction or only in the lateral direction.

In this embodiment mode, description is made of the case in which the groove as a depressed portion is formed on the other surface of the substrate 101B. However, what is formed on the other surface of the substrate 101B is not limited to the groove as long as the surface area of the other surface of the substrate 101B increases. In addition, the number of depressed portions (grooves) formed on the other surface of the substrate 101B may be one or more.

As set forth above, when the depressed portion is formed on the other surface of the substrate 101B, the surface area of the other surface of the substrate 101B can increase.

Although in the above description, the thinning treatment is applied to the other surface of the substrate 101A after the groove 103A is formed on the other surface of the substrate 101A, the thinning treatment of the substrate 101A is not necessarily performed if the thickness of the substrate 101A is not required to be reduced. However, the thickness of the substrate 101B after the thinning treatment can be reduced by the thinning treatment of the substrate 101A; therefore, the size of the integrated circuit device can be reduced as compared to the case in which the thinning treatment of the substrate 101A is not performed.

Then, the groove 103B formed on the substrate 101B is filled with a heat sink material 110, or a film containing a heat sink material is formed at least over the surface of the groove 103B by CVD, sputtering, spin coating, ink jet printing, or the like. As the heat sink material, a material with higher thermal conductivity than a material for the substrate 101B is used.

For example, the thermal conductivity of glass or quartz is about 1 W/(m·K) at 20° C. Accordingly, if a glass substrate or a quartz substrate is used as the substrate 101B, a material with higher thermal conductivity than glass or quartz, for example, a material with a thermal conductivity of 2 W/(m·K) or more, preferably 10 W/(m·K) or more, and more preferably 100 W/(m·K) or more may be used. Note that in this specification, the thermal conductivity means thermal conductivity measured at 20° C. As a specific example of a heat sink material capable of being used relative to a glass substrate or a quartz substrate, there are Si, metal (e.g., magnesium, aluminum, duralumin, iron, nickel, zinc, tin, copper, or the like), alloy, aluminum nitride, graphite, silicon nitride, and the like. It is also possible to use a material obtained by mixing high concentrations of these materials with polymer, or the like.

Further, the thermal conductivity of Si is about 148 W/(m·K). Accordingly, if a Si substrate is used as the substrate 101B, a material with higher thermal conductivity than Si, for example, with a thermal conductivity of 150 W/(m·K) or more, and preferably 200 W/(m·K) or more may be used. As a specific example of a heat sink material capable of being used relative to a Si substrate, there are aluminum nitride, aluminum, duralumin, copper, and the like. It is also possible to use a material obtained by mixing high concentrations of these materials with polymer, or the like.

Figure 3A:
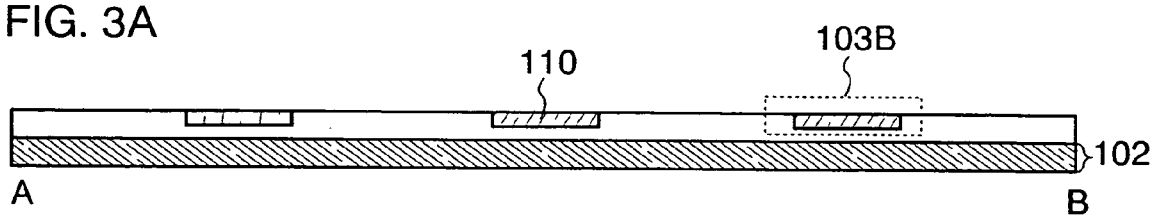
FIG. 3A is a cross sectional view and FIGS. 3B and 3C are perspective views showing Embodiment Mode 1.
Figure 3B:
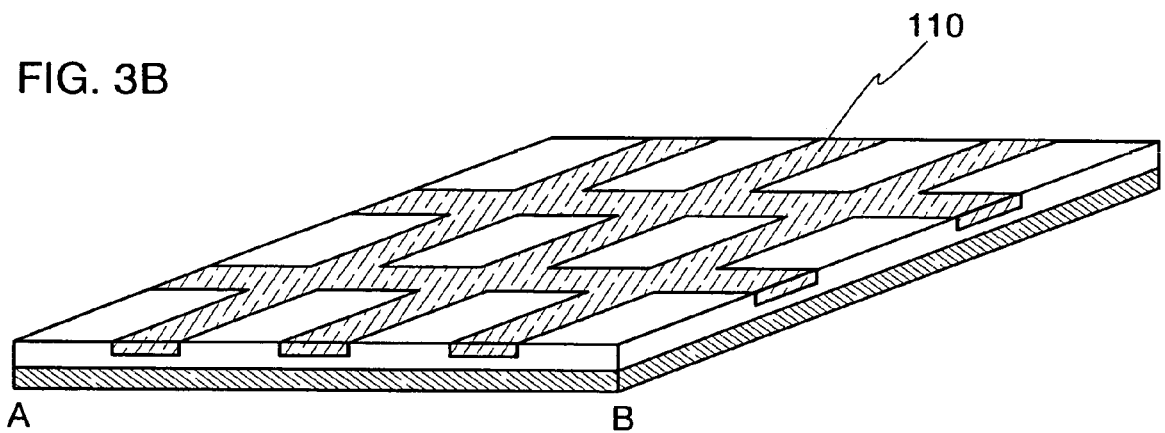

FIGS. 3A and 3B show an example of such a structure. FIGS. 3A and 3B each show a case in which the groove 103B is filled with the heat sink material 110. Note that FIG. 3B is a perspective view of an integrated circuit device and FIG. 3A is a cross sectional view along a line A-B of FIG. 3B.

Figure 29A:
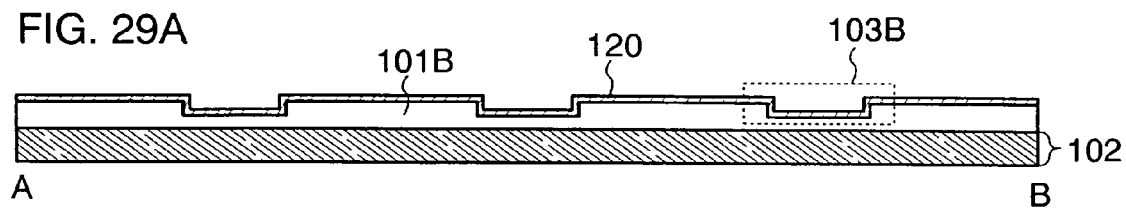
FIG. 29A is a cross sectional view and FIG. 29B is a perspective view showing Embodiment Mode 1.
Figure 29B:
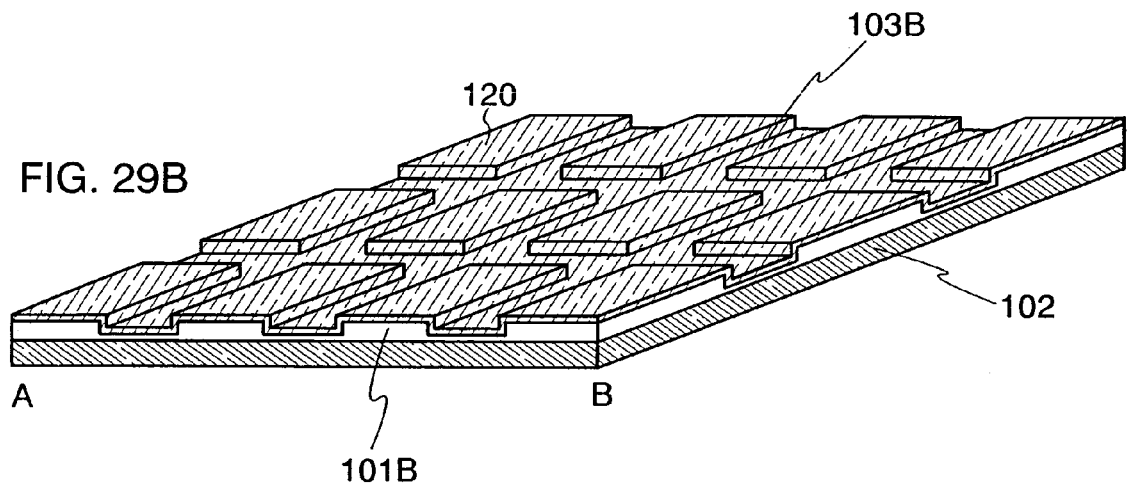

FIGS. 29A and 29B show an example in which a film 120 containing a heat sink material is formed over the entire surface of the substrate 101B, on which the groove 103B is formed, as an example of the case in which a film containing a heat sink material is formed at least over the surface of the groove 103B. Note that FIG. 29B is a perspective view of an integrated circuit device and FIG. 29A is a cross sectional view along a line A-B of FIG. 29B.

According to such a structure, the other surface of the substrate 101B can have a larger surface area and higher heat dissipation properties due to the heat sink material; thus, heat generated from the integrated circuit can be easily dissipated.

In FIGS. 3A and 3B, one substrate over one surface of which an integrated circuit is formed is used. The invention can be applied more effectively to an integrated circuit device with a structure in which a plurality of substrates each having a surface over which an integrated circuit is formed are stacked. When a plurality of substrates each provided with an integrated circuit are stacked, an occupied area can be reduced and an integrated circuit device can thus be miniaturized. However, as the integrated circuits are stacked, heat generated from the integrated circuits is not dissipated easily. If a depressed portion is formed on a surface of each substrate, over which the integrated circuit is not formed, and the depressed portion is filled with a heat sink material or a film containing a heat sink material is formed at least over the surface of the depressed portion, heat generated from the integrated circuit of each of the stacked integrated circuit devices can be easily dissipated. An integrated circuit device having such a structure is shown in FIG. 3C.

Figure 3C:
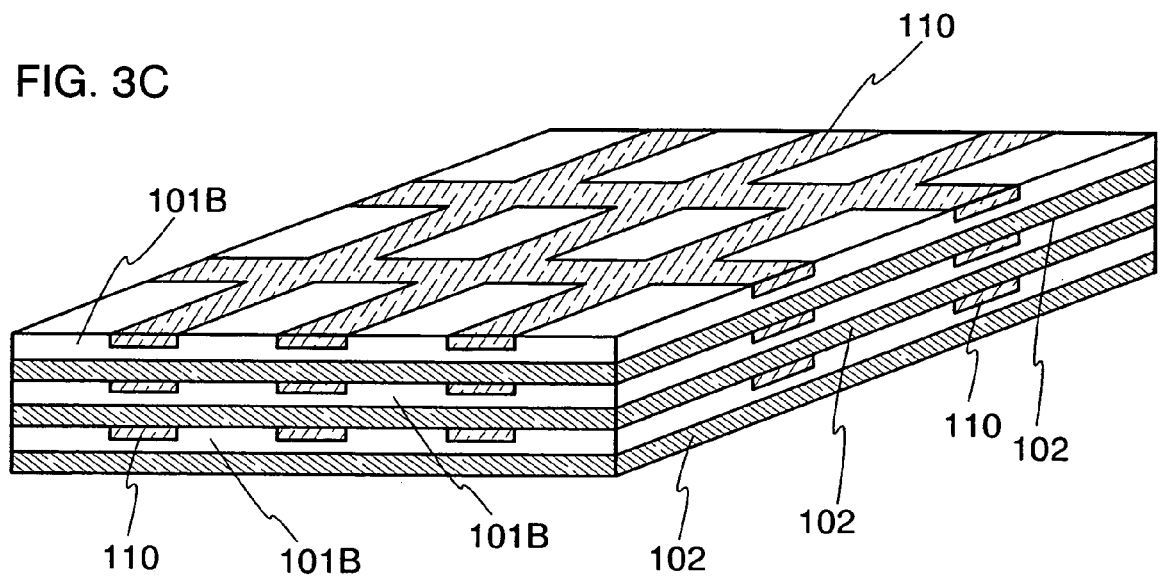

FIG. 3C shows a case in which three integrated circuit devices shown in FIGS. 3A and 3B are stacked. Although the three substrates 101B each provided with a layer including an integrated circuit are stacked in FIG. 3C, the number of stacked substrates is not limited to three and may be two or more.

The heat sink material is not necessarily made of one kind of material, and two or more kinds of materials may be stacked or two or more kinds of materials may be formed in different places.

If a plurality of substrates are stacked, integrated circuits formed over the different substrates may or may not be electrically connected to each other.

In this embodiment mode, the groove is formed on the other surface of the substrate 101A before the thinning treatment of the other surface of the substrate 101A. However, the groove may be formed on the other surface of the substrate 10A after the thinning treatment of the other surface of the substrate 101A.

Embodiment Mode 2

In this embodiment mode, an example of a method for manufacturing a semiconductor device of the invention is described more specifically than in Embodiment Mode 1 with reference to drawings. Described in this embodiment mode is a case in which an integrated circuit including a thin film transistor is formed as an integrated circuit.

Figure 4A:
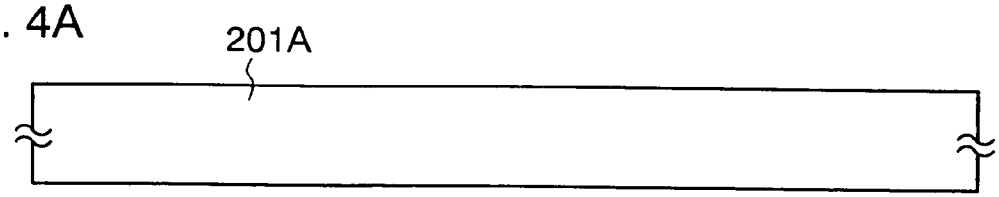
FIGS. 4A to 4E are cross sectional views showing Embodiment Mode 2.

First, a first substrate 201A is prepared as shown in FIG. 4A. The first substrate 201A may be a glass substrate, a quartz substrate, a metal substrate (such as a ceramic substrate and a stainless steel substrate), or the like. A semiconductor substrate such as a Si substrate may also be used. Alternatively, a flexible substrate such as a resin substrate (plastic substrate) typified by polyethylene terephthalate (PET), polyethylene naphthalate (PEN), polyether sulfone (PES), acrylic, or the like may be used. A surface of the substrate may be smoothed in advance by polishing.

Figure 4B:
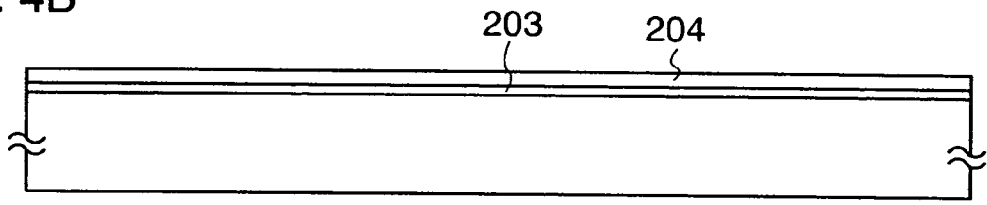

Then, as shown in FIG. 4B, an insulating film 203 functioning as a base film is formed over one surface of the first substrate 201A, and a semiconductor film 204 is formed over the insulating film 203.

The insulating film 203 may be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) ($x>y>0$) film, and a silicon nitride oxide ($SiN_xO_y$) (x>y>0) film. For example, if the insulating film 203 has a two-layer structure, a silicon nitride oxide film may be formed as a first insulating film and a silicon oxynitride film may be formed as a second insulating film. Meanwhile, if the insulating film 203 has a three-layer structure, a silicon oxynitride film may be formed as a first insulating film, a silicon nitride oxide film may be formed as a second insulating film, and a silicon oxynitride film may be formed as a third insulating film. When the insulating film 203 functioning as a base film is thus formed, alkali metal such as Na or alkaline earth metal can be prevented from diffusing from the first substrate 201A into the semiconductor film 204 and adversely affecting the characteristics of semiconductor elements.

The semiconductor film 204 can be made of an amorphous semiconductor or a semi-amorphous semiconductor (SAS). A polycrystalline semiconductor film may also be used. The SAS is a semiconductor having an intermediate structure between amorphous and crystalline (including single crystalline and polycrystalline) structures. This semiconductor has a third state that is stable in free energy, and it includes a crystalline region that has a short range order and a lattice distortion. A crystalline region with a width of 0.5 to 20 nm can be observed in at least a part of the SAS film, and Raman spectrum is shifted to the lower wavenumber than 520 cm$^{-1}$ if silicon is mainly contained. The SAS has an X-ray diffraction pattern with peaks at (111) and (220) that are considered to be due to silicon crystal lattice. Further, the SAS is mixed with at least 1 atomic % of hydrogen or halogen. The SAS is obtained by glow discharge decomposition (plasma CVD) of silicon compound gas. As the silicon compound gas, not only $SiH_4$ but also $Si_2H_6$, $SiH_2Cl_2$, $SiHCl_3$, $SiCl_4$, $SiF_4$, or the like may be used. In addition, $GeF_4$ may be mixed into the gas. The silicon compound gas may be diluted with $H_2$, or $H_2$ and one or more kinds of rare gas elements selected from He, Ar, Kr, and Ne. If the silicon compound gas is diluted, the dilution rate is 2 to 1000, the pressure is 0.1 to 133 Pa, and the power supply frequency is 1 to 120 MHz, and preferably 13 to 60 MHz. The substrate may be heated at a temperature of 300° C. or lower. Among the impurity elements in the film, atmospheric impurity elements such as oxygen, nitrogen, and carbon desirably have a concentration of $1\times10^{20}$ cm$^{-1}$ or less. In particular, the concentration of oxygen is preferably $5\times10^{19}$/cm$^3$ or less, and more preferably $1\times10^{19}$/cm$^3$ or less. In this embodiment mode, an amorphous semiconductor film is formed by sputtering, CVD, or the like using a material that mainly contains silicon (Si) (e.g., $Si_xGe_{1-x}$, or the like), and the amorphous semiconductor film is crystallized by a crystallizing method such as laser crystallization, thermal crystallization using RTA or an annealing furnace, and thermal crystallization using a metal element that promotes crystallization. Alternatively, the semiconductor film may be crystallized using thermal plasma that is generated by applying a DC bias.

Figure 4C:
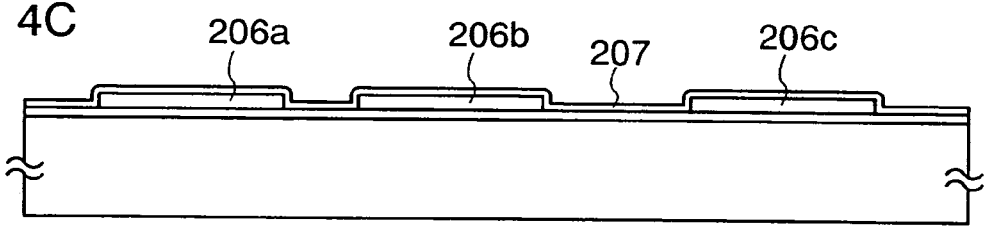

Then, as shown in FIG. 4C, the semiconductor film 204 is selectively etched to form island shaped semiconductor films 206a to 206c, and a gate insulating film 207 is formed to cover the island shaped semiconductor films 206a to 206c.

The gate insulating film 207 may be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) (x>y>0) film, and a silicon nitride oxide ($SiN_xO_y$) (x>y>0) film. The gate insulating film may also be formed by oxidizing or nitriding the surface of the island shaped semiconductor films 206a to 206c by a high density plasma treatment. The high density plasma treatment is performed in an oxygen atmosphere (e.g., an atmosphere including oxygen ($O_2$) and a rare gas (containing at least one of He, Ne, Ar, Kr, and Xe), or an atmosphere including oxygen, hydrogen ($H_2$), and a rare gas); or in a nitrogen atmosphere (e.g., an atmosphere including nitrogen ($N_2$) and a rare gas (containing at least one of He, Ne, Ar, Kr, and Xe), an atmosphere including nitrogen, hydrogen, and a rare gas, or an atmosphere including $NH_3$ and a rare gas). When the gate insulating film is formed of an oxidized layer or a nitrided layer that is obtained by oxidizing or nitriding the island shaped semiconductor films 206a to 206c by the high density plasma treatment, the gate insulating film is superior in flatness of film thickness and the like and has high density as compared to a film formed by CVD, sputtering, or the like.

Figure 4D:
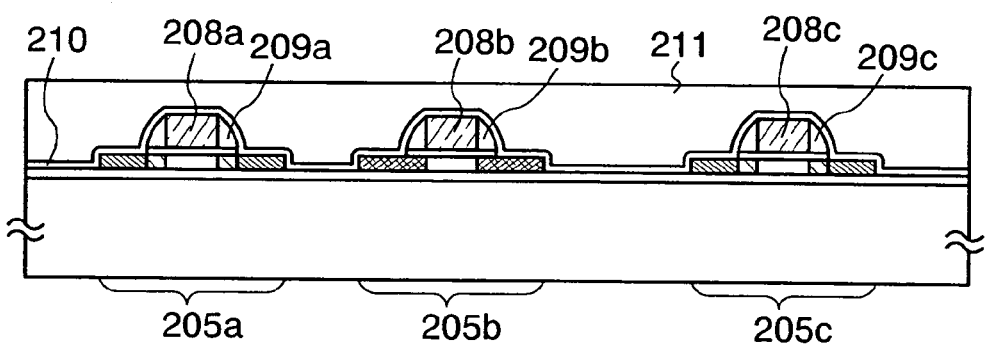

Then, as shown in FIG. 4D, gate electrodes 208a to 208c are selectively formed over the gate insulating film 207, thereby forming thin film transistors 205a to 205c.

In the thin film transistors 205a to 205c, a part of each of the semiconductor films 206a to 206c is used as a channel region, and side walls 209a to 209c (hereinafter also referred to as insulating films 209a to 209c) are formed so as to be in contact with side surfaces of the gate electrodes 208a to 208c, respectively.

The N-channel thin film transistors 205a and 205c each have an LDD region in the semiconductor films 206a and 206c under the insulating films 209a and 209c, respectively. Specifically, the LDD region is formed between a source or drain region and a channel region. The LDD region is not provided in the P-channel thin film transistor 205b, and a source region and a drain region are formed in the semiconductor film 206b under the insulating film 209b.

The gate electrodes 208a to 208c can be formed by CVD, sputtering, or the like to have a single layer structure or a stacked layer structure using an element selected from tantalum (Ta), tungsten (W), titanium (Ti), molybdenum (Mo), aluminum (Al), copper (Cu), chromium (Cr), and niobium (Nb), or an alloy material or a compound material mainly containing such an element. The gate electrodes 208a to 208c can also be made of a semiconductor material typified by polycrystalline silicon doped with an impurity element such as phosphorus. For example, a stacked layer structure of tantalum nitride and tungsten may be employed.

The insulating films 209a to 209c can be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) (x>y>0) film, and a silicon nitride oxide ($SiN_xO_y$) (x>y>0) film, or a film containing carbon such as DLC (Diamond Like Carbon).

Then, an insulating film 210 and an insulating film 211 are formed to cover the thin film transistors 205a to 205c.

The insulating film 210 can be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) (x>y>0) film, and a silicon nitride oxide ($SiN_xO_y$) (x>y>0) film, or a film containing carbon such as DLC (Diamond Like Carbon).

The insulating film 211 can be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) (x>y>0) film, and a silicon nitride oxide ($SiN_xO_y$) (x>y>0) film; a film containing carbon such as DLC (Diamond Like Carbon); or a film made of an organic material such as epoxy, polyimide, polyamide, polyvinylphenol, benzocyclobutene, and acrylic, a siloxane material such as siloxane resin, an oxazole resin, or the like. The siloxane material is a material including a Si—O—Si bond. Siloxane is composed of a skeleton formed by the bond of silicon (Si) and oxygen (O), in which an organic group containing at least hydrogen (such as an alkyl group and aromatic hydrocarbon) is included as a substituent. Alternatively, a fluoro group may be used as the substituent. Further alternatively, a fluoro group and an organic group containing at least hydrogen may be used as the substituent. The oxazole resin is, for example, photosensitive polybenzoxazole or the like. The photosensitive polybenzoxazole has a low dielectric constant (a dielectric constant of 2.9 at 1 MHz and a normal temperature), high heat resistance (thermal decomposition temperature of 550° C. with the rise in temperature at 5° C./min, which is measured by TGA: Thermal Gravity Analysis), and a low moisture absorbing rate (0.3% in 24 hours at a normal temperature). The oxazole resin has a lower relative dielectric constant (about 2.9) as compared to polyimide and the like (about 3.2 to 3.4); therefore, generation of parasitic capacitance can be suppressed and high speed operation can be achieved. Note that in FIGS. 4A to 4E, the insulating film 210 is not necessarily provided, and the insulating film 211 may be formed to directly cover the thin film transistors 205a to 205c.

Figure 4E:
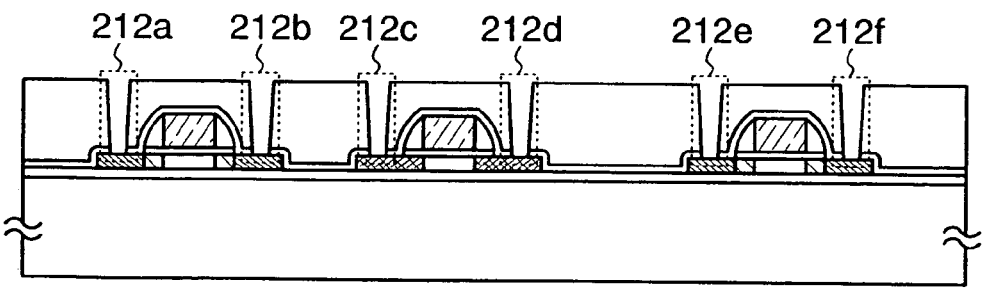

Then, as shown in FIG. 4E, the insulating film 211, the insulating film 210, and the like are selectively removed, thereby forming openings 212a to 212f to expose a part of the source regions or the drain regions of the semiconductor films 206a to 206c in the thin film transistors 205a to 205c.

Figure 5A:
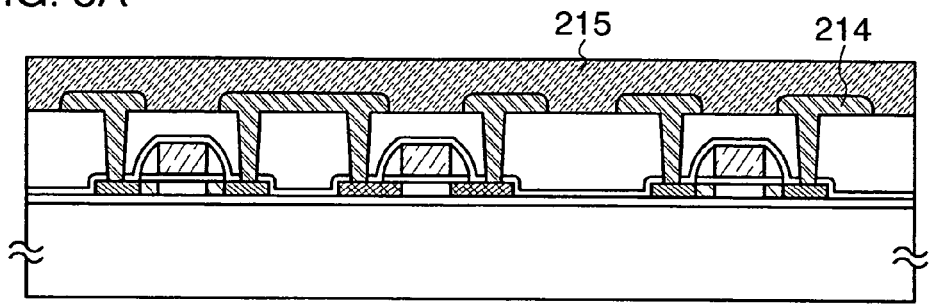
FIGS. 5A to 5C are cross sectional views showing Embodiment Mode 2.

Subsequently, as shown in FIG. 5A, an electrode 214 is formed to be electrically connected to the source region or the drain region of the semiconductor films 206a to 206c. Then, an insulating film 215 functioning as a protective film is formed to cover the electrode 214.

The electrode 214 can be formed by CVD, sputtering, screen printing, droplet discharging, a dispenser method, or the like to have a single layer structure or a stacked layer structure using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), and carbon (C), or an alloy containing some of these elements. For example, as a conductive film made of an alloy containing some of these elements, an Al alloy containing C and Ti, an Al alloy containing Ni, an Al alloy containing C and Ni, an Al alloy containing C and Mn, or the like may be used. If a stacked layer structure is employed, for example, Ti, Al, and Ti may be stacked in this order.

The insulating film 215 can be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) (x>y>0) film, and a silicon nitride oxide ($SiN_xO_y$) (x>y>0) film; a film containing carbon such as DLC (Diamond Like Carbon); or a film made of an organic material such as epoxy, polyimide, polyamide, polyvinylphenol, benzocyclobutene, and acrylic, or a siloxane material such as siloxane resin.

Figure 5B:
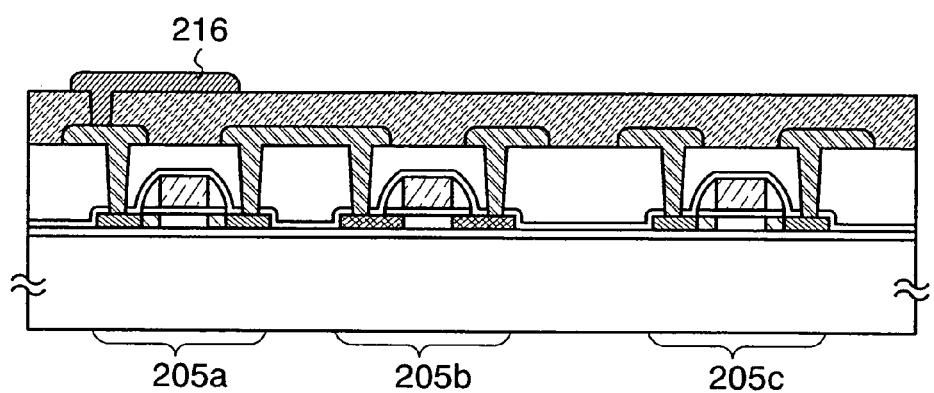

Then, as shown in FIG. 5B, an electrode 216 is formed over the insulating film 215 so as to be electrically connected to the electrode 214 that is electrically connected to the source region or the drain region of the thin film transistor 205a. The electrode 216 may be formed using the same method and material as the electrode 214.

Figure 5C:
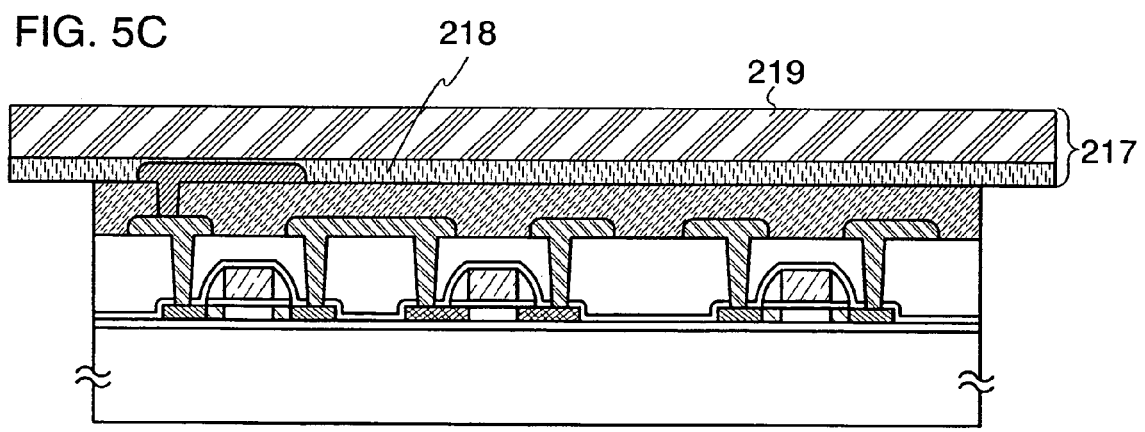

Subsequently, as shown in FIG. 5C, a UV separating film 217 is attached onto the insulating film 215 and the electrode 216. The UV separating film 217 has a structure in which an adhesive layer 218 is provided over a base film 219 made of a resin material. The adhesive layer 218 is made of a resin material, the adhesion of which is reduced by UV (ultraviolet) irradiation. As a material used for the base film, for example, polyester, PET (polyethylene terephthalate), PEN (polyethylene naphthalate), and the like can be given.

Although the UV separating film is used here, a second substrate may be attached with a UV separating adhesive (an adhesive, the adhesion of which is reduced by UV (ultraviolet) irradiation) instead of the UV separating film. Alternatively, a thermal separating film may be used instead of the UV separating film, or a second substrate may be attached with a thermal separating adhesive (an adhesive, the adhesion of which is reduced by heating). The thermal separating film has a structure in which an adhesive layer is formed over a base film, and the adhesive layer is made of a resin material, the adhesion of which is reduced by heating. If the thermal separating film is used or a second substrate is attached with a thermal separating adhesive, a heat treatment is performed in a subsequent step instead of UV irradiation.

Figure 6A:
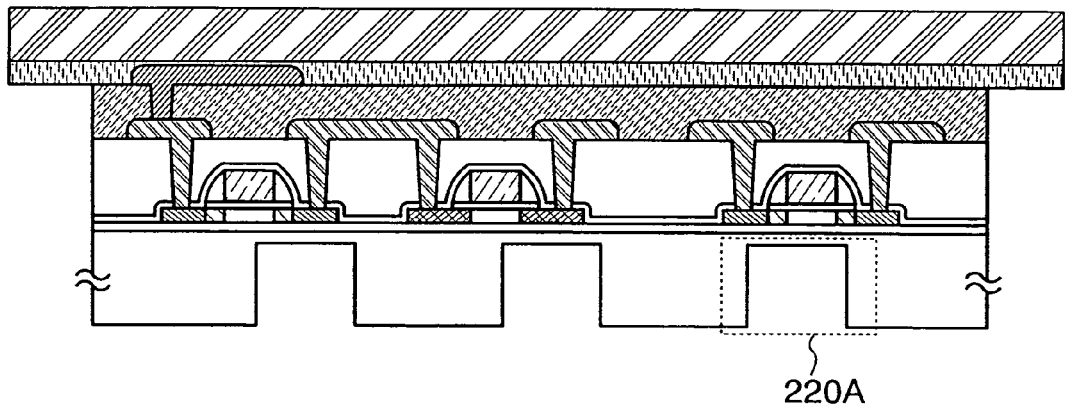
FIGS. 6A to 6C are cross sectional views showing Embodiment Mode 2.

Then, as shown in FIG. 6A, a groove 220A as a depressed portion is formed on a surface of the first substrate 201A, over which an integrated circuit (the thin film transistors 205a to 205c) is not formed (hereinafter referred to as the other surface of the first substrate 201A). The groove 220A may be formed by etching or laser processing. The groove 220A may also be formed by mechanically grinding. Further, a plastic substrate, only one surface of which has depressed and projecting portions formed in advance, may also be used as the first substrate 201A.

Although the cross section of the groove 220A has a rectangular shape in FIG. 6A, it is not particularly limited to this shape. The cross section of the groove 220A may have a U shape or a wedge shape, or a side surface of the groove 220A may have a tapered shape.

Figure 6B:
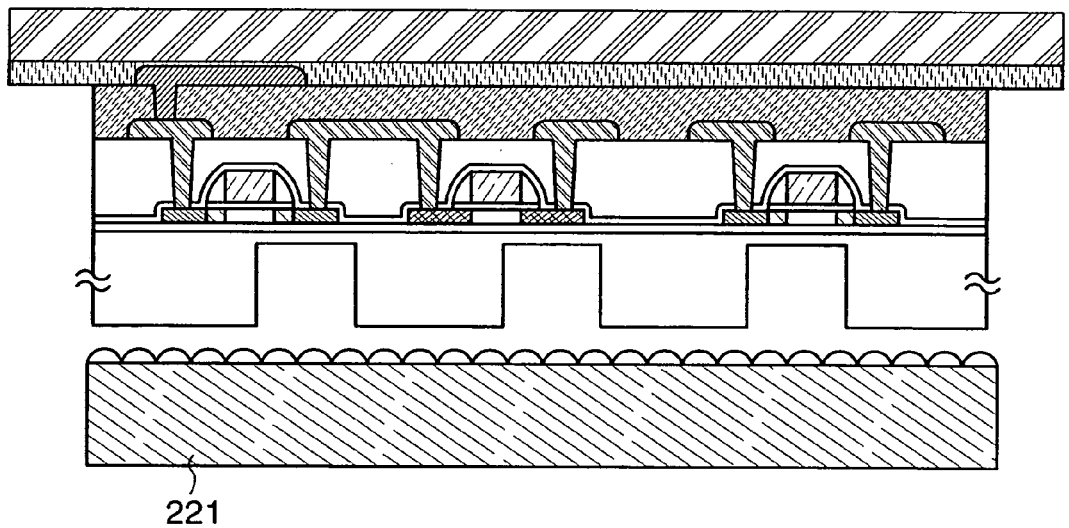

Then, as shown in FIG. 6B, the other surface of the first substrate 201A is subjected to a treatment for reducing the thickness of the first substrate 201A (thinning treatment) using a grinding or polishing means 221. For example, the first substrate 201A is ground by the grinding means so as to have a thickness of 100 μm or less, and then polished by the polishing means so as to have a thickness of 20 μm or less. When the ground surface of the first substrate 201A is further polished in this manner, the other surface of the first substrate 201A can be smoothed. Described here is the example of performing the thinning treatment by grinding with the grinding means and then polishing with the polishing means; however, the invention is not limited to this, and only the grinding treatment may be performed using the grinding means, or only the polishing treatment may be performed using the polishing means.

In addition, although the thinning treatment of the first substrate 201A is performed by the grinding means or the polishing means, the invention is not limited to this, and the thinning treatment of the first substrate 201A may be performed by etching using a chemical treatment. If a glass substrate is used as the first substrate 201A, chemical etching can be performed using a drug solution containing hydrofluoric acid.

Furthermore, the thinning treatment of the first substrate 201A may be performed by combining the grinding treatment, the polishing treatment, and the etching treatment. For example, the thinning treatment of the first substrate 201A may be achieved by performing the chemical etching after one or both of the grinding treatment and the polishing treatment, or may be achieved by performing one or both of the grinding treatment and the polishing treatment after the etching treatment.

Figure 6C:
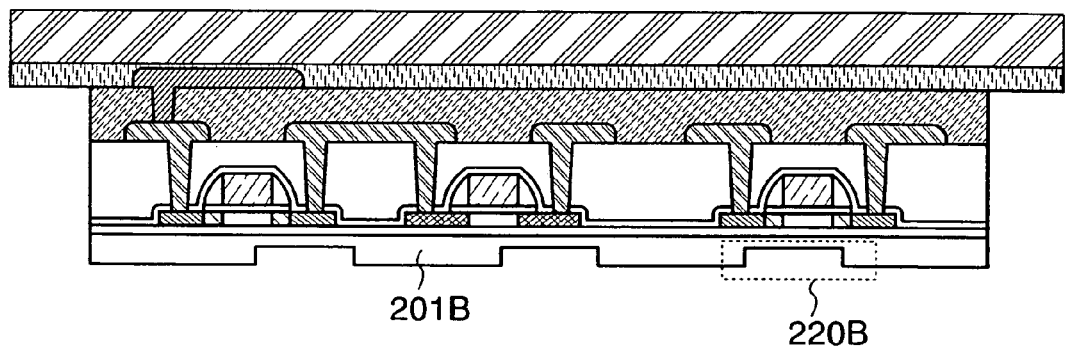

FIG. 6C shows a state in which the thinning treatment of the first substrate 201A is completed. Through the thinning treatment, the thickness of the first substrate is reduced to be a substrate 201B, and the depth of the groove 220A that is formed on the other surface of the first substrate is reduced to be a groove 220B.

Although the cross section of the groove 220B after the thinning treatment of the substrate has a rectangular shape in FIG. 6C, it is not particularly limited to this shape. Similarly to the cross section of the groove 220A before the thinning treatment of the substrate, the cross section of the groove 220B may have a U shape or a wedge shape, or a side surface of the groove 220B may have a tapered shape.

The thickness of the first substrate 201B after the thinning treatment is 100 μm or less, preferably 50 μm or less, and more preferably 30 μm or less. When the thickness of the first substrate 201B is 100 μm or less, the first substrate 201B has flexibility; therefore, a flexible integrated circuit device can be obtained finally. In addition, since the first substrate 201B functions as a protective film to maintain the durability of the integrated circuit device and to prevent impurity elements, moisture, and the like from entering the elements of the integrated circuit, the thickness of the first substrate 201B is 1 μm or more, preferably 2 μm or more, and more preferably 4 μm or more.

What is formed on the other surface of the first substrate 201B is not limited to the groove as long as the surface area of the other surface of the first substrate 201B increases.

Although not shown, the groove 220B is filled with a heat sink material or a film containing a heat sink material is formed at least over the surface of the groove 220B, similarly to Embodiment Mode 1.

In this manner, when the groove 220B as a depressed portion is formed on the other surface of the first substrate 201B and the groove 220B is filled with a heat sink material or a film containing a heat sink material is formed at least over the surface of the groove 220B, the other surface of the first substrate 201B can have a larger surface area and higher heat dissipation properties due to the heat sink material; thus, heat generated from the integrated circuit can be easily dissipated.

Figure 7A:
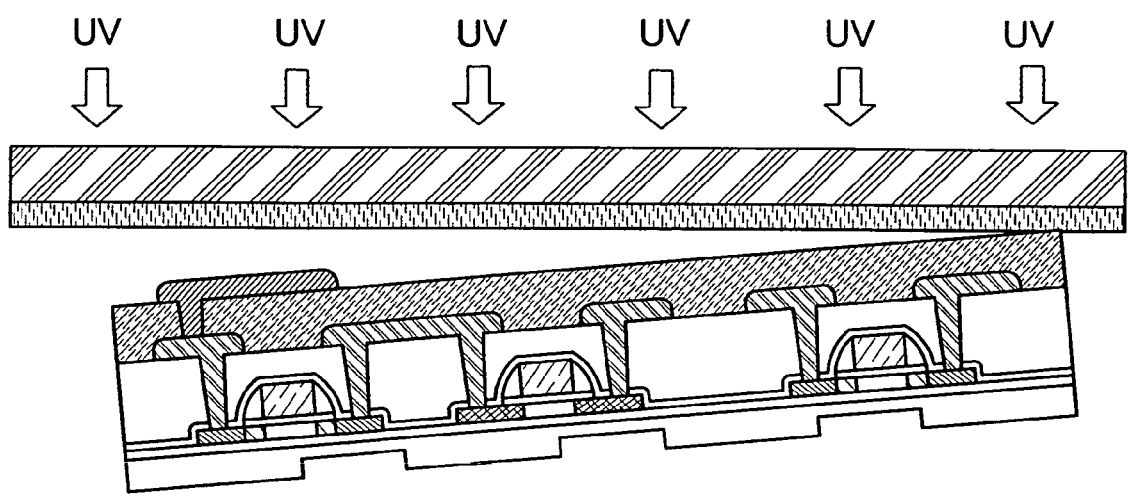
FIGS. 7A and 7B are cross sectional views showing Embodiment Mode 2.

Then, as shown in FIG. 7A, the UV (ultraviolet) separating film 217 is irradiated with UV (ultraviolet) in order to separate the UV (ultraviolet) separating film 217 that is attached onto the insulating film 215 and the electrode 216. By this UV (ultraviolet) irradiation, the adhesion of the adhesive layer 218 in the UV separating film 217 is reduced, and thus the UV separating film 217 can be separated.

If a thermal separating film is used instead of the UV separating film or a second substrate is attached onto the insulating film 215 and the electrode 216 with a thermal separating adhesive, a heat treatment is performed instead of UV (ultraviolet) irradiation. By the heat treatment, the adhesion of an adhesive layer in the thermal separating film or the adhesion of the thermal separating adhesive is reduced, and thus the thermal separating film or the second substrate can be separated.

Figure 7B:
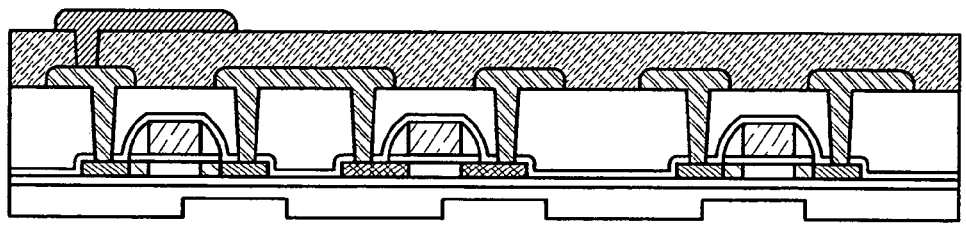

Through the aforementioned steps, such an integrated circuit device as shown in FIG. 7B can be obtained.

Although FIGS. 4A to 7B show the example in which the integrated circuit having the thin film transistors is formed over the first substrate, the invention is not limited to this. As an element of the integrated circuit, a field effect transistor (FET) may be provided using a semiconductor substrate such as a Si substrate as a channel, or an organic thin film transistor (TFT) using an organic material as a channel may be provided.

Figure 21A:
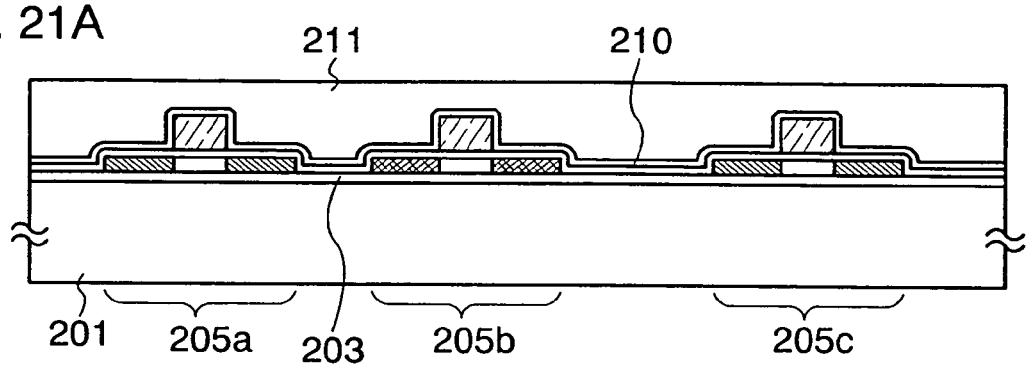
FIGS. 21A to 21C show a structure of a thin film transistor.
Figure 21B:
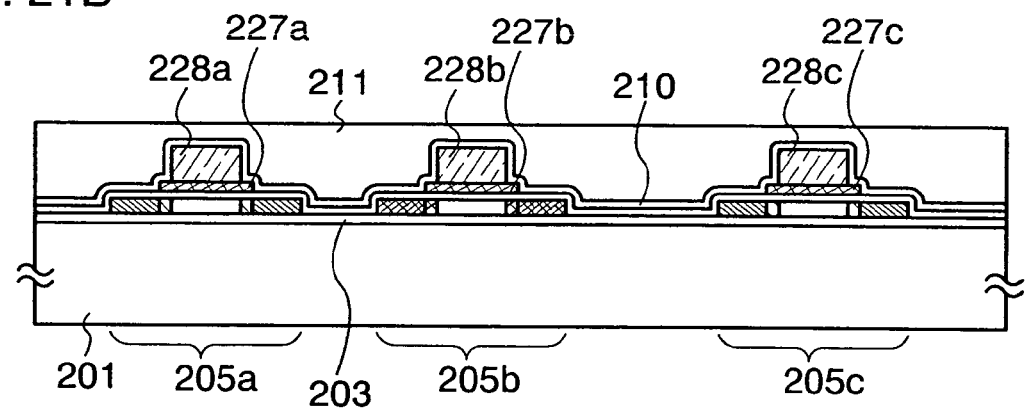
Figure 21C:
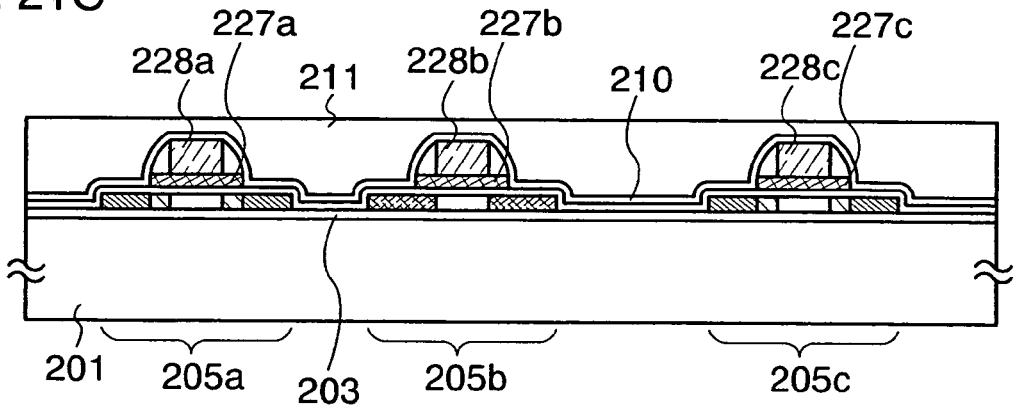

The structure of the thin film transistors included in the semiconductor device of the invention is not limited to the aforementioned one. For example, in FIG. 4D, the LDD regions are provided in the semiconductor films 206a and 206c under the insulating films 209a and 209c formed at the side surface of the gate electrodes 208a and 208c of the N-channel thin film transistors 205a and 205c, respectively, while the LDD region is not provided in the P-channel thin film transistor 205b. However, it is also possible to adopt a structure in which the LDD regions are provided in both the N-channel thin film transistors and the P-channel thin film transistor, or a structure in which the LDD region is not provided in both the N-channel thin film transistors and the P-channel thin film transistor (FIG. 21A). In addition, the structure of the thin film transistors is not limited to the aforementioned one, and a single gate structure including one channel forming region as well as a multi-gate structure such as a double gate structure including two channel forming regions and a triple gate structure including three channel forming regions may be employed. Further, it is possible to adopt a bottom gate structure or a dual gate structure in which two gate electrodes are formed over and under a channel forming region with gate insulating films interposed therebetween. If each gate electrode has a stacked layer structure of first conductive films 227a to 227c and second conductive films 228a to 228c formed over the first conductive films 227a to 227c, LDD regions may be provided so as to overlap the first conductive films 227a to 227c and not to overlap the second conductive films 228a to 228c (FIG. 21B). Further, if each gate electrode has a stacked layer structure of the first conductive films 227a to 227c and the second conductive films 228a to 228c formed over the first conductive films 227a to 227c, side walls may be provided over the first conductive films 227a to 227c so as to be in contact with the second conductive films 228a to 228c (FIG. 21C). In the aforementioned structures, an impurity region functioning as a source region or a drain region of a semiconductor film may be made of a silicide of Ni, Co, W, Mo, or the like.

Although in the above description, the thinning treatment is applied to the other surface of the substrate 201A after the groove 220A is formed on the other surface of the substrate 201A, the thinning treatment of the substrate 201A is not necessarily performed if the thickness of the substrate 201A is not required to be reduced. However, the thickness of the substrate 201B after the thinning treatment can be reduced by the thinning treatment of the substrate 201A; therefore, the size of the integrated circuit device can be reduced as compared to the case in which the thinning treatment of the substrate 201A is not performed.

The heat sink material is not necessarily made of one kind of material, and two or more kinds of materials may be stacked or two or more kinds of materials may be formed in different places.

The structure shown in this embodiment mode can be implemented in combination with other embodiment modes and embodiments.

Embodiment Mode 3

In this embodiment mode, an example of a method for manufacturing a semiconductor device of the invention, which is different from that shown in Embodiment Mode 2, is described more specifically than in Embodiment Mode 1 with reference to drawings. Described in this embodiment mode is a case in which an integrated circuit including a thin film transistor is formed as an integrated circuit.

Figure 8A:
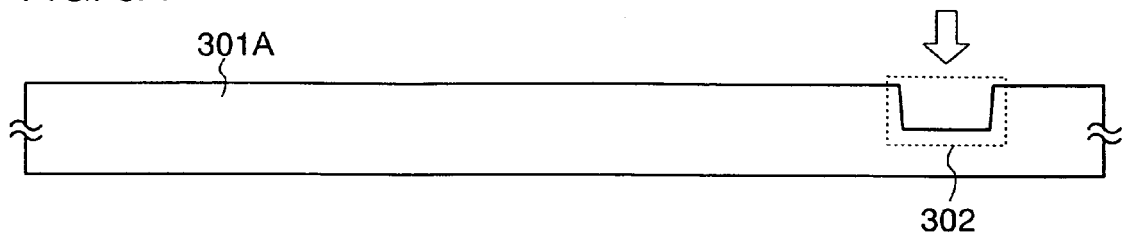
FIGS. 8A to 8E are cross sectional views showing Embodiment Mode 3.

First, as shown in FIG. 8A, a depressed portion 302 is selectively formed on a surface of a first substrate 301A by etching, laser irradiation, or the like. Instead of forming the depressed portion on the surface of the first substrate 301A, an opening may be formed so as to pass through from a surface of the first substrate 301A to the other surface thereof. The depressed portion 302 (or the opening, if any) may have any shape, for example, a linear shape, a circular shape, a rectangular shape, or the like. The depth of the depressed portion 302 is preferably 1 to 100 µm, and more preferably 2 to 50 µm, and the width of the depressed portion 302 is preferably 10 µm to 10 mm, and more preferably 100 µm to 1 mm. If the opening is formed instead of the depressed portion, the width of the opening is preferably 10 µm to 10 mm, and more preferably 100 µm to 1 mm. Note that the depressed portion or the opening formed on the substrate may have a tapered shape in the depth direction.

Figure 8B:
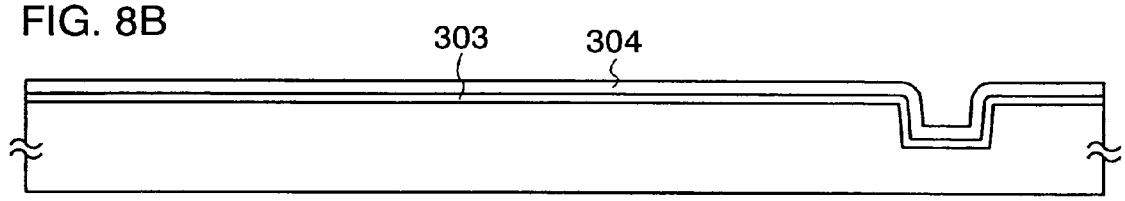

Next, as shown in FIG. 8B, an insulating film 303 functioning as a base film is formed over the first substrate 301A, and a semiconductor film 304 is formed over the insulating film 303. Note that the insulating film 303 and the semiconductor film 304 are also formed in the depressed portion 302.

The insulating film 303 can be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) (x>y>0) film, and a silicon nitride oxide ($SiN_xO_y$) (x>y>0) film. For example, if the insulating film 303 has a two-layer structure, a silicon nitride oxide film may be formed as a first insulating film and a silicon oxynitride film may be formed as a second insulating film. Meanwhile, if the insulating film 303 has a three-layer structure, a silicon oxynitride film may be formed as a first insulating film, a silicon nitride oxide film may be formed as a second insulating film, and a silicon oxynitride film may be formed as a third insulating film. When the insulating film 303 functioning as a base film is thus formed, alkali metal such as Na or alkaline earth metal can be prevented from diffusing from the first substrate 301A into the semiconductor film 304 and adversely affecting the characteristics of semiconductor elements.

The semiconductor film 304 can be made of an amorphous semiconductor or a semi-amorphous semiconductor (SAS). A polycrystalline semiconductor film may also be used.

Figure 8C:
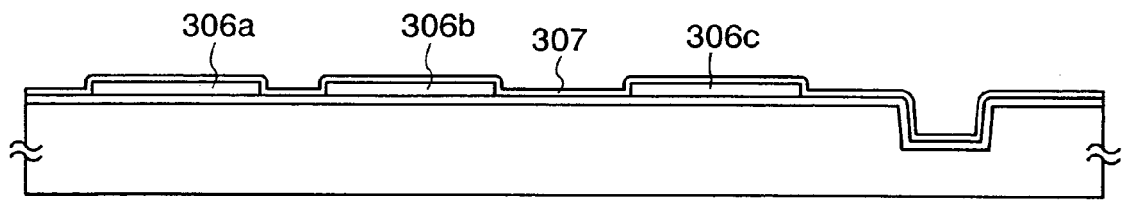

Then, as shown in FIG. 8C, the semiconductor film 304 is selectively etched to form island shaped semiconductor films 306a to 306c, and a gate insulating film 307 is formed to cover the island shaped semiconductor films 306a to 306c.

The gate insulating film 307 can be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) (x>y>0) film, and a silicon nitride oxide ($SiN_xO_y$) (x>y>0) film. The gate insulating film 307 may also be formed by oxidizing or nitriding the surface of the island shaped semiconductor films 306a to 306c by a high density plasma treatment. The high density plasma treatment is performed in an oxygen atmosphere (e.g., an atmosphere including oxygen ($O_2$) and a rare gas (containing at least one of He, Ne, Ar, Kr, and Xe); or an atmosphere including oxygen, hydrogen ($H_2$), and a rare gas), or in a nitrogen atmosphere (e.g., an atmosphere including nitrogen ($N_2$) and a rare gas (containing at least one of He, Ne, Ar, Kr, and Xe); an atmosphere including nitrogen, hydrogen, and a rare gas; or an atmosphere including $NH_3$ and a rare gas). When the gate insulating film is formed of an oxidized layer or a nitrided layer that is obtained by oxidizing or nitriding the island shaped semiconductor films 306a to 306c by the high density plasma treatment, the gate insulating film is superior in flatness of film thickness and the like and has high density as compared to a film formed by CVD, sputtering, or the like.

Figure 8D:
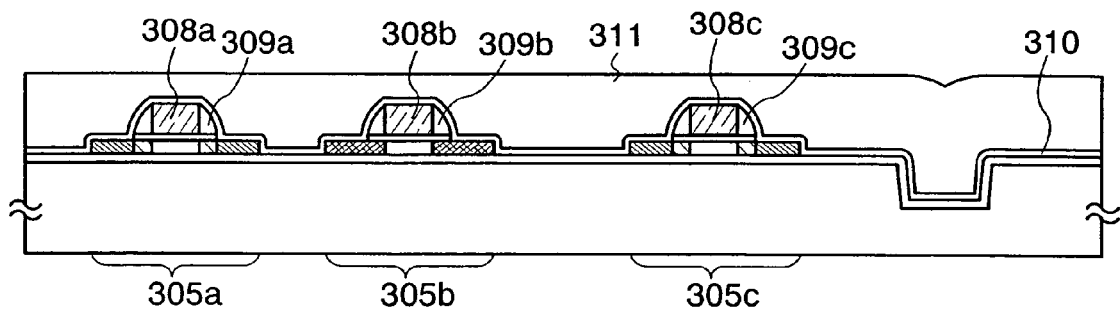

Then, as shown in FIG. 8D, gate electrodes 308a to 308c are selectively formed over the gate insulating film 307, thereby forming thin film transistors 305a to 305c.

In the thin film transistors 305a to 305c, a part of each of the semiconductor films 306a to 306c is used as a channel region, and side walls 309a to 309c (hereinafter also referred to as insulating films 309a to 309c) are formed so as to be in contact with side surfaces of the gate electrodes 308a to 308c, respectively.

The N-channel thin film transistors 305a and 305c each have an LDD region in the semiconductor films 306a and 306c under the insulating films 309a and 309c, respectively. Specifically, the LDD region is formed between a source or drain region and a channel region. The LDD region is not provided in the P-channel thin film transistor 305b, and a source region and a drain region are formed in the semiconductor film 306b under the insulating film 309b.

The gate electrodes 308a to 308c can be formed by CVD, sputtering, or the like to have a single layer structure or a stacked layer structure using an element selected from tantalum (Ta), tungsten (W), titanium (Ti), molybdenum (Mo), aluminum (Al), copper (Cu), chromium (Cr), and niobium (Nb), or an alloy material or a compound material mainly containing such an element. The gate electrodes 308a to 308c can also be made of a semiconductor material typified by polycrystalline silicon doped with an impurity element such as phosphorus. For example, a stacked layer structure of tantalum nitride and tungsten may be employed.

The insulating films 309a to 309c can be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) (x>y>0) film, and a silicon nitride oxide ($SiN_xO_y$) (x>y>0) film, or a film containing carbon such as DLC (Diamond Like Carbon).

Subsequently, an insulating film 310 and an insulating film 311 are formed to cover the thin film transistors 305a to 305c.

The insulating film 310 can be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) (x>y>0) film, and a silicon nitride oxide ($SiN_xO_y$) (x>y>0) film, or a film containing carbon such as DLC (Diamond Like Carbon).

The insulating film 311 can be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) (x>y>0) film, and a silicon nitride oxide ($SiN_xO_y$) (x>y>0) film; a film containing carbon such as DLC (Diamond Like Carbon); or a film made of an organic material such as epoxy, polyimide, polyamide, polyvinylphenol, benzocyclobutene, and acrylic, or a siloxane material such as siloxane resin. Note that in FIGS. 8A to 8E, the insulating film 310 is not necessarily provided, and the insulating film 311 may be formed to directly cover the gate electrodes 308a to 308c.

Figure 8E:
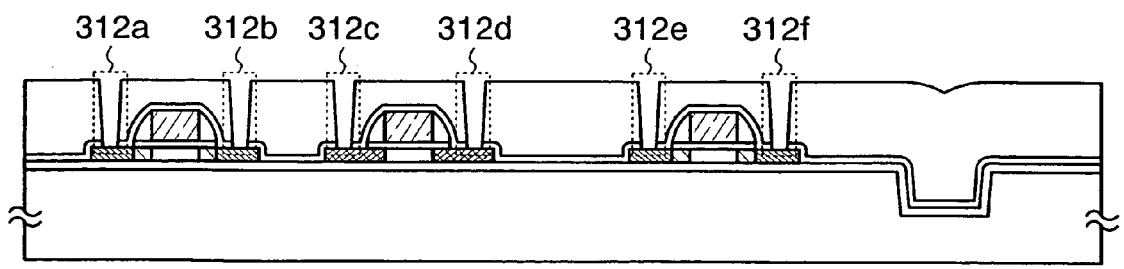

Then, as shown in FIG. 8E, the insulating film 311, the insulating film 310, and the like are selectively removed, thereby forming openings 312a to 312f to expose a part of the semiconductor films 306a to 306c, which functions as a source or drain region of the thin film transistors 305a to 305c.

Figure 9A:
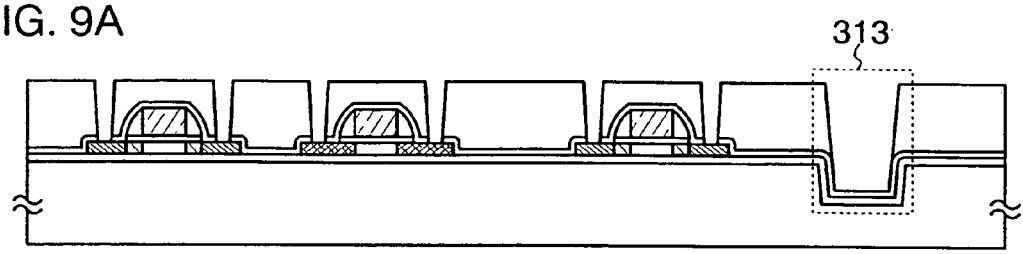
FIGS. 9A to 9D are cross sectional views showing Embodiment Mode 3.

Subsequently, as shown in FIG. 9A, the insulating film 311 and the like formed over the depressed portion 302 are selectively removed, thereby forming an opening 313. The opening 313 is only required be formed so that a conductive film 314 formed in the opening 313 in a subsequent step is exposed in the thinning treatment of the first substrate 301A. Therefore, the opening 313 may be formed by selectively removing a part of the insulating film 311, selectively removing the insulating film 311 and the insulating film 310, or selectively removing the insulating film 311, the insulating film 310, and the insulating film 303. In addition, although an example in which the opening 313 is formed after forming the openings 312a to 312f is shown here, the opening 313 may be formed at the same time as the openings 312a to 312f or before forming the openings 312a to 312f. Alternatively, the opening 313 may be formed after the openings 312a to 312f are formed and a conductive film is selectively formed in the openings 312a to 312f. The openings 312a to 312f and the opening 313 may be formed by etching using a photolithography step, or by laser irradiation.

Figure 9B:
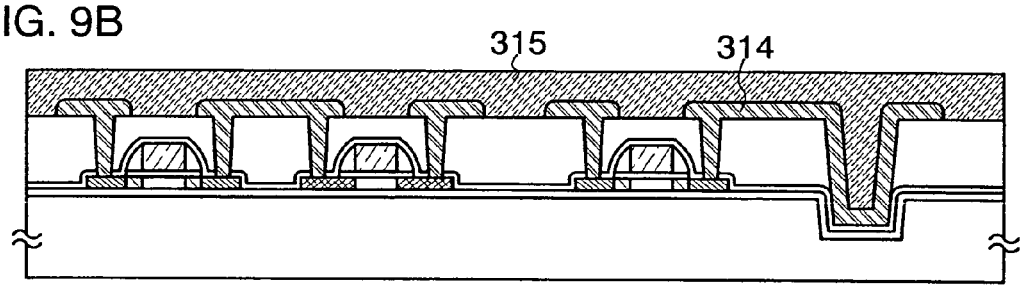

Then, as shown in FIG. 9B, the conductive film 314 is selectively formed in the openings 312a to 312f and the opening 313, thereby forming an electrode that is electrically connected to the source region or the drain region of each of the thin film transistors 305a to 305c. The electrode that is electrically connected to one of the source region and the drain region of the thin film transistor 305c extends within the opening 313. Then, an insulating film 315 functioning as a protective film is formed to cover the conductive film 314.

The conductive film 314 can be formed by CVD, sputtering, screen printing, droplet discharging, a dispenser method, or the like to have a single layer structure or a stacked layer structure using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), and carbon (C), or an alloy containing some of these elements. For example, as a conductive film made of an alloy containing some of these elements, an Al alloy containing C and Ti, an Al alloy containing Ni, an Al alloy containing C and Ni, an Al alloy containing C and Mn, or the like may be used. If a stacked layer structure is employed, for example, Ti, Al, and Ti may be stacked in this order.

In addition, when the opening 313 is large or when it is concerned that defective connection such as disconnection occurs in the conductive film 314 provided in the opening 313, it is preferable to selectively provide again the opening 313 with a conductive material after providing the conductive film 314 in the opening 313. For example, after the conductive film 314 is selectively formed in the openings 312a to 312f and the opening 313 by CVD, sputtering, or the like, a conductive material is formed by screen printing, droplet discharging, a dispenser method, or the like over the conductive film 314 formed in the opening 313.

In this embodiment mode, as shown in FIG. 22A, with the use of a screen printing method, a paste 384 is squeezed out of an opening 385 provided in an emulsion 382 while pushing to move the paste 384 over a mesh 381 with a squeegee 383, thereby forming a conductive material 386 in the opening 313.

Alternatively, as shown in FIG. 22B, after the conductive film 314 is formed in the openings 312a to 312f by CVD or sputtering, the conductive material 386 may be selectively provided in the opening 313 by screen printing, droplet discharging, a dispenser method, or the like. When the conductive material is thus selectively formed in the opening 313 by screen printing, droplet discharging, a dispenser method, or the like, it is possible to prevent disconnection and the like of the conductive film in the opening 313 and to fill with the conductive material up to the bottom of the opening 313.

The insulating film 315 can be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) (x>y>0) film, and a silicon nitride oxide ($SiN_xO_y$) (x>y>0) film; a film containing carbon such as DLC (Diamond Like Carbon); or a film made of an organic material such as epoxy, polyimide, polyamide, polyvinylphenol, benzocyclobutene, and acrylic, or a siloxane material such as siloxane resin.

Figure 9C:
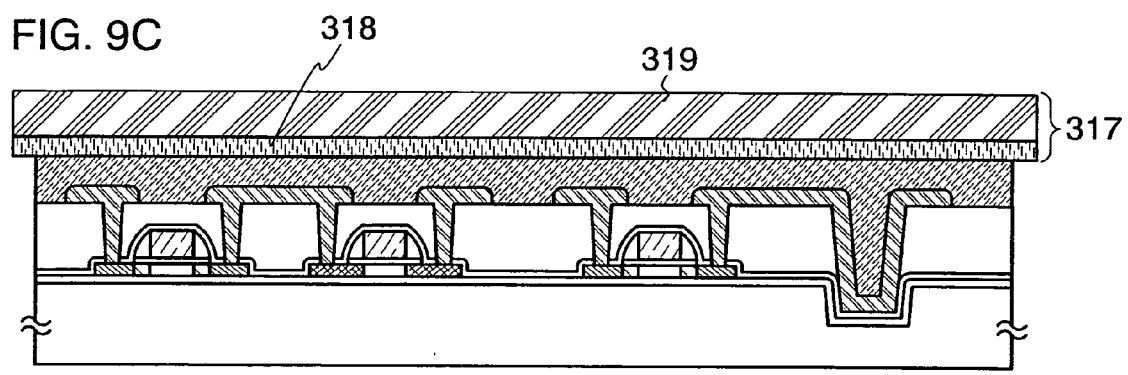

Next, as shown in FIG. 9C, a UV separating film 317 is attached onto the insulating film 315. The UV separating film 317 has a structure in which an adhesive layer 318 is provided over a base film 319 made of a resin material. The adhesive layer 318 is made of a resin material, the adhesion of which is reduced by UV (ultraviolet) irradiation. As a material used for the base film, for example, polyester, PET (polyethylene terephthalate), PEN (polyethylene naphthalate), and the like can be given.

Although the UV separating film is used here, a second substrate may be attached with a UV separating adhesive (an adhesive, the adhesion of which is reduced by UV (ultraviolet) irradiation) instead of the UV separating film. Alternatively, a thermal separating film may be used instead of the UV separating film, or a second substrate may be attached with a thermal separating adhesive (an adhesive, the adhesion of which is reduced by heating). The thermal separating film has a structure in which an adhesive layer is formed over a base film, and the adhesive layer is made of a resin material, the adhesion of which is reduced by heating. If the thermal separating film is used or a second substrate is attached with a thermal separating adhesive, a heat treatment is performed in a subsequent step instead of UV irradiation.

Figure 9D:
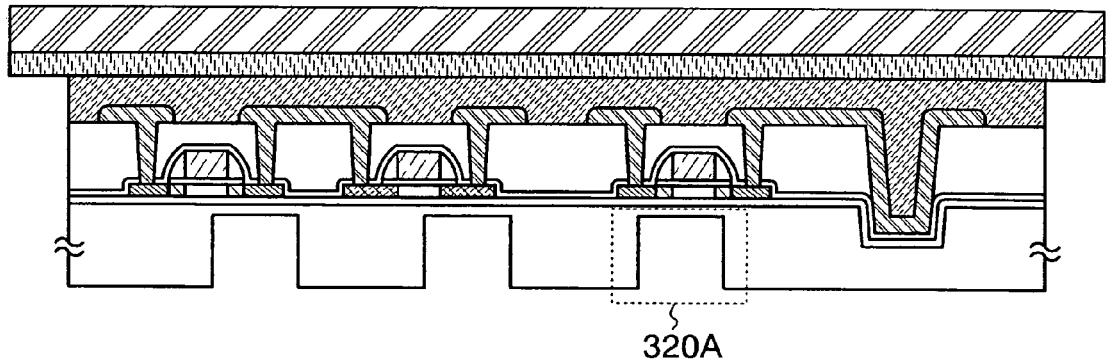

Then, as shown in FIG. 9D, a groove 320A as a depressed portion is formed on a surface of the first substrate 301A, over which the integrated circuit is not formed (hereinafter referred to as the other surface of the first substrate 301A). The groove 320A may be formed by etching or laser processing. The groove 320A may also be formed by mechanically grinding. Further, a plastic substrate, only one surface of which has depressed and projecting portions formed in advance, may also be used as the first substrate 301A.

Although the cross section of the groove 320A has a rectangular shape in FIG. 9D, it is not particularly limited to this shape. The cross section of the groove 320A may have a U shape or a wedge shape, or a side surface of the groove 320A may have a tapered shape.

Figure 10A:
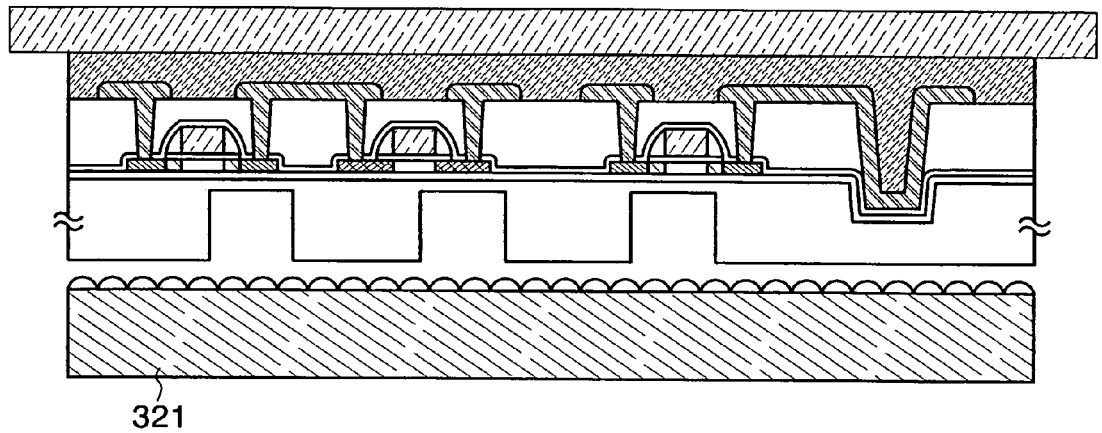
FIGS. 10A to 10C are cross sectional views showing Embodiment Mode 3.

Then, as shown in FIG. 10A, the other surface of the first substrate 301A is subjected to a treatment for reducing the thickness of the first substrate 301A (thinning treatment) using a grinding or polishing means 321. For example, the first substrate 301A is ground by the grinding means so as to have a thickness of 100 μm or less, and then polished by the polishing means so as to have a thickness of 20 μm or less. When the ground surface of the first substrate 301A is further polished in this manner, the other surface of the first substrate 301A can be smoothed. Described here is the example of performing the thinning treatment by grinding with the grinding means and then polishing with the polishing means; however, the invention is not limited to this, and only the grinding treatment may be performed using the grinding means, or only the polishing treatment may be performed using the polishing means.

In addition, although the thinning treatment of the first substrate 301A is performed by the grinding means or the polishing means, the invention is not limited to this, and the thinning treatment of the first substrate 301A may be performed by etching using a chemical treatment. If a glass substrate is used as the first substrate 301A, chemical etching can be performed using a drug solution containing hydrofluoric acid.

Furthermore, the thinning treatment of the first substrate 301A may be performed by combining any of the grinding treatment, the polishing treatment, and the etching treatment. For example, the thinning treatment of the first substrate 301A may be achieved by performing the chemical etching after one or both of the grinding treatment and the polishing treatment, or may be achieved by performing one or both of the grinding treatment and the polishing treatment after the etching treatment.

Figure 10B:
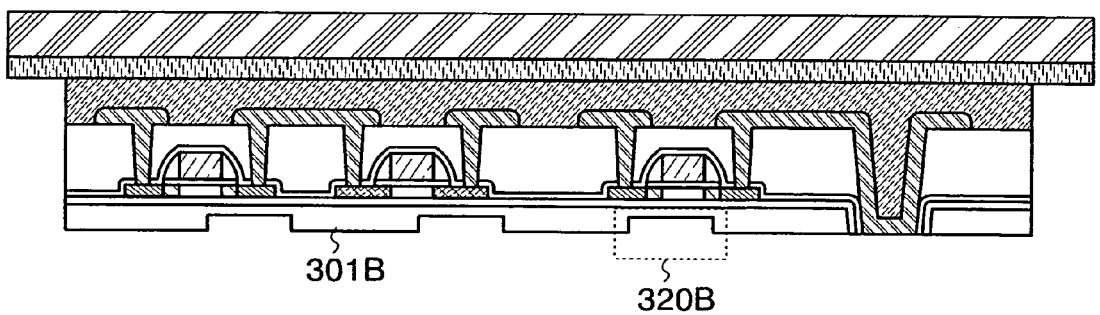

The thinning treatment of the first substrate 301A is performed until the conductive film 314 formed in the opening 313 is exposed as shown in FIG. 10B. If the conductive film 314 and the conductive material 386 are formed in the opening 313 as shown in FIG. 22A, the thinning treatment of the first substrate 301A is performed until one or both of the conductive film 314 and the conductive material 386 are exposed. Meanwhile, if the conductive material 386 is formed in the opening 313 as shown in FIG. 22B, the thinning treatment of the first substrate 301A is performed until the conductive material 386 is exposed. Accordingly, when the insulating film 310, the insulating film 303, and the like are formed under the conductive film 314 or the conductive material 386 in the opening 313, the insulating film 310 and the insulating film 303 are removed at the same time as the thinning treatment of the first substrate 301A.

If a glass substrate is used as the first substrate 301A, chemical etching can be performed using a drug solution containing hydrofluoric acid.

FIG. 10B shows a state in which the thinning treatment of the first substrate 301A is completed. Through the thinning treatment, the thickness of the first substrate is reduced to be a substrate 301B, and the depth of the groove 320A that is formed on the other surface of the first substrate is reduced to be a groove 320B.

Although the cross section of the groove 320B after the thinning treatment of the substrate has a rectangular shape in FIG. 10B, it is not particularly limited to this shape. Similarly to the cross section of the groove 320A before the thinning treatment of the substrate, the cross section of the groove 320B may have a U shape or a wedge shape, or a side surface of the groove 320B may have a tapered shape.

The thickness of the first substrate 301B after the thinning treatment is 100 µm or less, preferably 50 µm or less, and more preferably 30 µm or less. When the thickness of the first substrate 301B is 100 µm or less, the first substrate 301B has flexibility; therefore, a flexible integrated circuit device can be obtained finally. In addition, since the first substrate 301B functions as a protective film to maintain the durability of the integrated circuit device and to prevent impurity elements, moisture, and the like from entering the elements of the integrated circuit, the thickness of the first substrate 301B is 1 µm or more, preferably 2 µm or more, and more preferably 4 µm or more.

What is formed on the other surface of the first substrate 301B is not limited to the groove as long as the surface area of the other surface of the first substrate 301B increases.

Although not shown, the groove 320B is filled with a heat sink material or a film containing a heat sink material is formed at least over the surface of the groove 320B, similarly to Embodiment Mode 1.

In this manner, when the groove 320B as a depressed portion is formed on the other surface of the first substrate 301B and the groove 320B is filled with a heat sink material or a film containing a heat sink material is formed at least over the surface of the groove 320B, the other surface of the first substrate 301B can have a larger surface area and higher heat dissipation properties due to the heat sink material, thus heat generated from the integrated circuit can be easily dissipated.

Figure 10C:
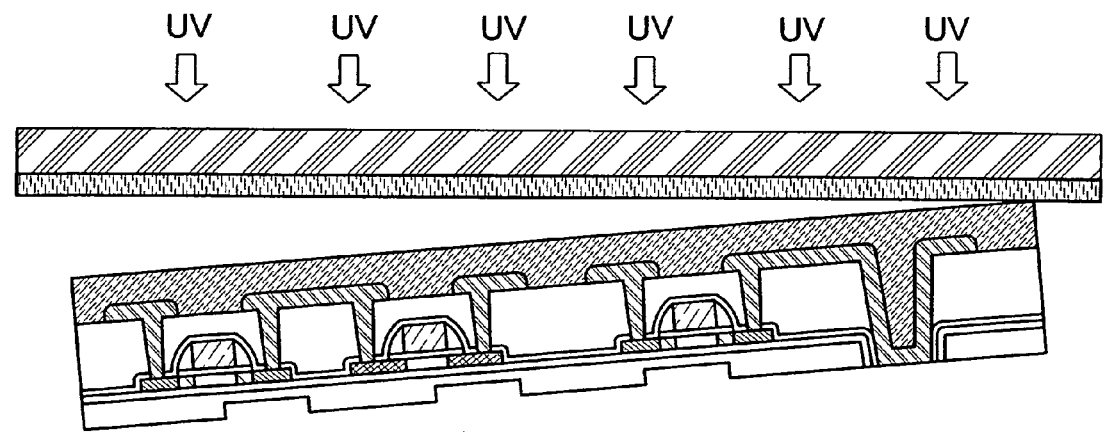

Then, as shown in FIG. 10C, the UV (ultraviolet) separating film 317 is irradiated with UV (ultraviolet) in order to separate the UV (ultraviolet) separating film 317 that is attached onto the insulating film 315. By this UV (ultraviolet) irradiation, the adhesion of the adhesive layer 318 in the UV separating film 317 is reduced, and thus the UV separating film 317 can be separated.

If a thermal separating film is used instead of the UV separating film or a second substrate is attached onto the insulating film 315 with a thermal separating adhesive, a heat treatment is performed instead of UV (ultraviolet) irradiation. By the heat treatment, the adhesion of an adhesive layer in the thermal separating film or the adhesion of the thermal separating adhesive is reduced, and thus the thermal separating film or the second substrate can be separated.

Figure 11:
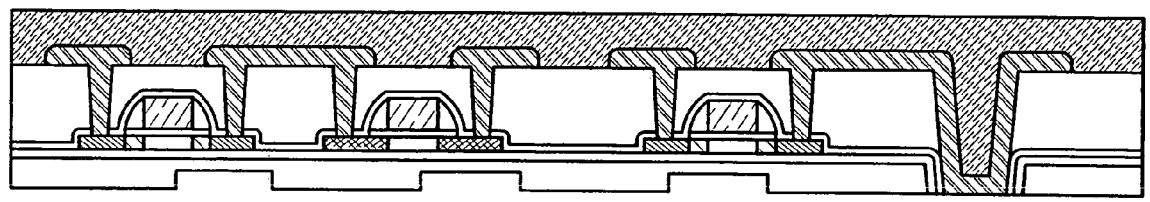
FIG. 11 is a cross sectional view showing Embodiment Mode 3.

Through the aforementioned steps, such an integrated circuit device as shown in FIG. 11 can be obtained.

Although FIGS. 8A to 11 show the example in which the thin film transistors are formed over the substrate, the invention is not limited to this. As an element of the integrated circuit, a field effect transistor (FET) may be provided using a semiconductor substrate such as a Si substrate as a channel, or an organic thin film transistor (TFT) using an organic material as a channel may be provided.

In addition, the structure of the thin film transistors included in the semiconductor device of the invention is not limited to the aforementioned one. The thin film transistors may have the structure described in Embodiment Mode 2.

The heat sink material is not necessarily made of one kind of material, and two or more kinds of materials may be stacked or two or more kinds of materials may be formed in different places.

The structure shown in this embodiment mode can be implemented in combination with other embodiment modes and embodiments.

Embodiment Mode 4

Described in this embodiment mode is a method for manufacturing an integrated circuit device having a structure with a combination of Embodiment Modes 2 and 3.

The state shown in FIG. 9B is completed by the method described in Embodiment Mode 3. When the state shown in FIG. 9B is obtained, an electrode 416 is formed over the insulating film 315 so as to be electrically connected to the source electrode or the drain electrode of the thin film transistor 305a.

Figure 12A:
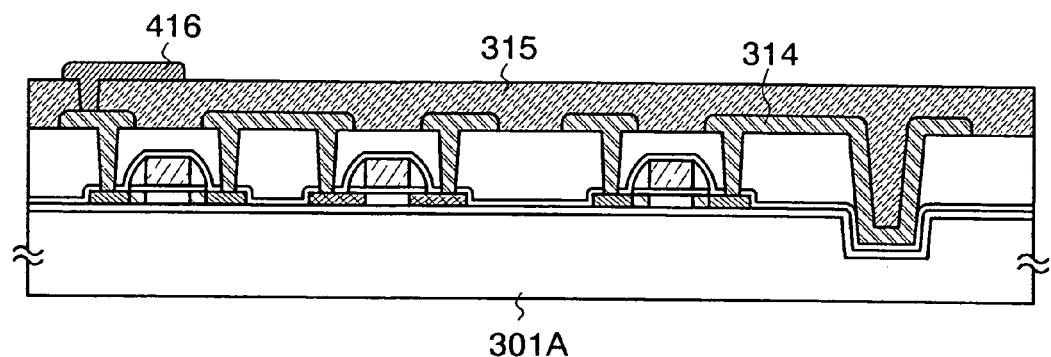
FIGS. 12A to 12C are cross sectional views showing Embodiment Mode 4.
Figure 12B:
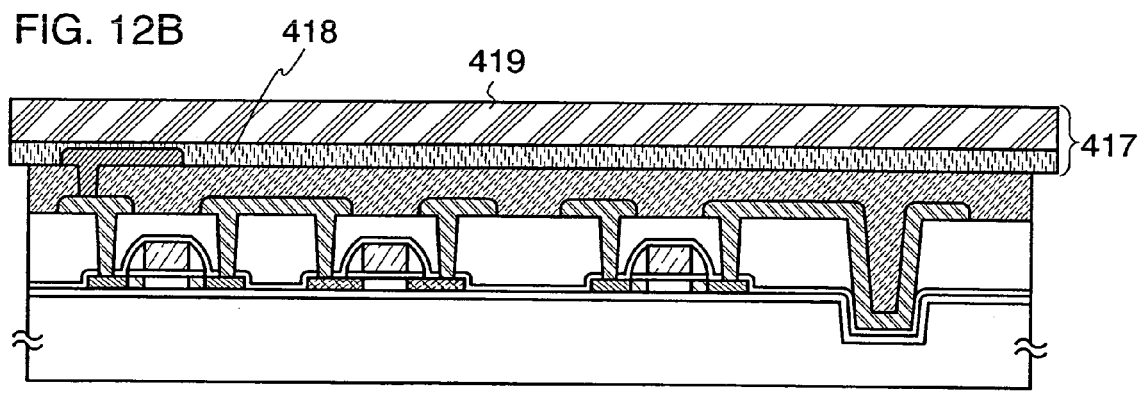

Next, as shown in FIG. 12B, a UV (ultraviolet) separating film 417 is attached onto the insulating film 315 and the electrode 416. The UV separating film 417 has a structure in which an adhesive layer 418 is provided over a base film 419 made of a resin material. The adhesive layer 418 is made of a resin material, the adhesion of which is reduced by UV (ultraviolet) irradiation. As a material used for the base film, for example, polyester, PET (polyethylene terephthalate), PEN (polyethylene naphthalate), and the like can be given.

Although the UV separating film is used here, a second substrate may be attached with a UV separating adhesive (an adhesive, the adhesion of which is reduced by UV (ultraviolet) irradiation) instead of the UV separating film. Alternatively, a thermal separating film may be used instead of the UV separating film, or a second substrate may be attached with a thermal separating adhesive (an adhesive, the adhesion of which is reduced by heating). The thermal separating film has a structure in which an adhesive layer is formed over a base film, and the adhesive layer is made of a resin material, the adhesion of which is reduced by heating. If the thermal separating film is used or a second substrate is attached with a thermal separating adhesive, a heat treatment is performed in a subsequent step instead of UV irradiation.

Figure 12C:
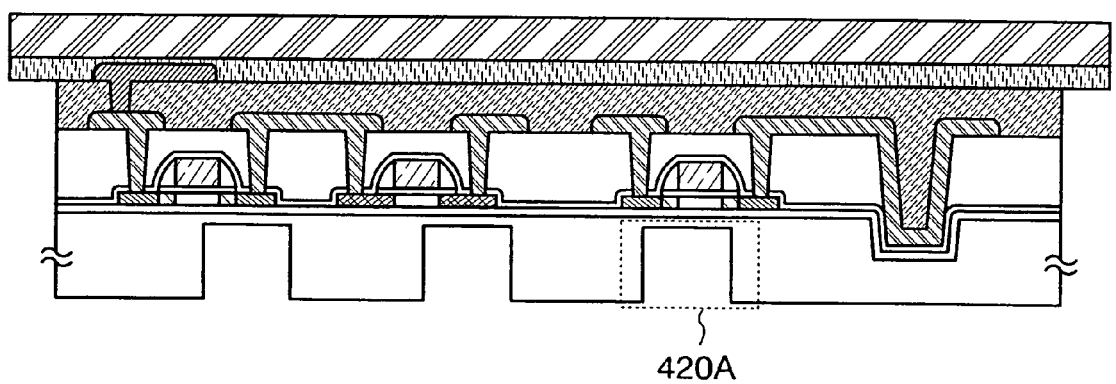

Then, as shown in FIG. 12C, a groove 420A as a depressed portion is formed on a surface of the first substrate 301A, over which the integrated circuit is not formed (hereinafter referred to as the other surface of the first substrate 301A). The groove 420A may be formed by etching or laser processing. The groove 420A may also be formed by mechanically grinding. Further, a plastic substrate, only one surface of which has depressed and projecting portions formed in advance, may also be used as the substrate 301A.

Although the cross section of the groove 420A has a rectangular shape in FIG. 12C, it is not particularly limited to this shape. The cross section of the groove 420A may have a U shape or a wedge shape, or a side surface of the groove 420A may have a tapered shape.

Figure 13A:
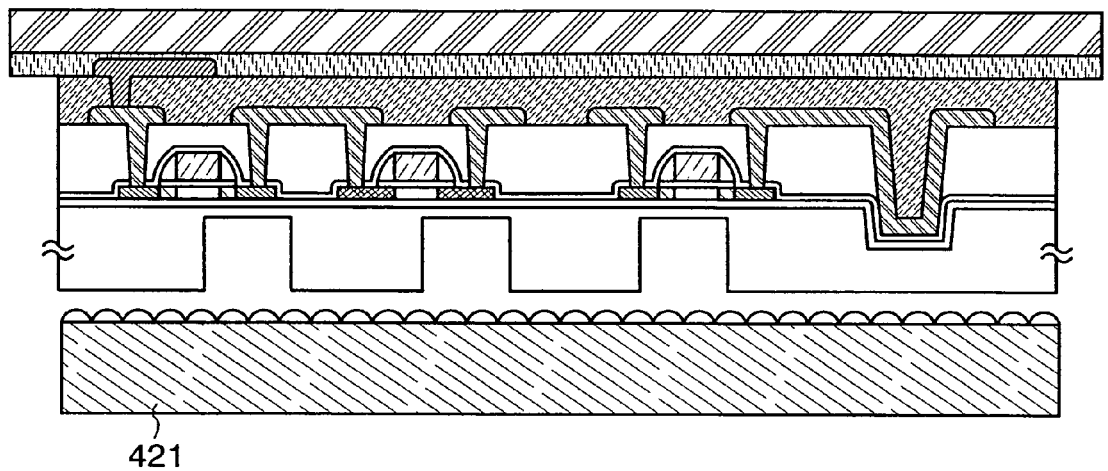
FIGS. 13A to 13C are cross sectional views showing Embodiment Mode 4.

Then, as shown in FIG. 13A, the other surface of the first substrate 301A is subjected to a treatment for reducing the thickness of the first substrate 301A (thinning treatment) using a grinding or polishing means 421. For example, the first substrate 301A is ground by the grinding means so as to have a thickness of 100 µm or less, and then polished by the polishing means so as to have a thickness of 20 µm or less. When the ground surface of the first substrate 301A is further polished in this manner, the other surface of the first substrate 301A can be smoothed. Described here is the example of performing the thinning treatment by grinding with the grinding means and then polishing with the polishing means; however, the invention is not limited to this, and only the grinding treatment may be performed using the grinding means, or only the polishing treatment may be performed using the polishing means.

In addition, although the thinning treatment of the first substrate 301A is performed by the grinding means or the polishing means, the invention is not limited to this, and the thinning of the first substrate 301A may be performed by etching using a chemical treatment. If a glass substrate is used as the first substrate 301A, chemical etching can be performed using a drug solution containing hydrofluoric acid.

Furthermore, the thinning treatment of the first substrate 301A may be performed by combining any of the grinding treatment, the polishing treatment, and the etching treatment. For example, the thinning of the first substrate 301A may be achieved by performing the chemical etching after one or both of the grinding treatment and the polishing treatment, or may be achieved by performing one or both of the grinding treatment and the polishing treatment after the etching treatment.

Figure 13B:
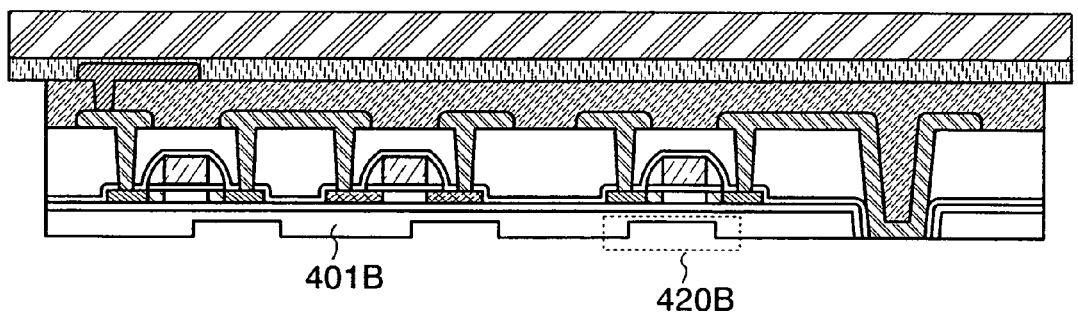

The thinning treatment of the first substrate 301A is performed until the conductive film 314 formed in the opening 313 is exposed as shown in FIG. 13B. If the conductive material 386 is also formed in the opening 313 as shown in FIG. 22A, the thinning treatment of the first substrate 301A is performed until one or both of the conductive film 314 and the conductive material 386 provided in the opening 313 are exposed. Meanwhile, if the conductive material 386 is formed in the opening 313 as shown in FIG. 22B, the thinning treatment of the first substrate 301A is performed until the conductive material 386 is exposed. Accordingly, when the insulating film 310, the insulating film 303, and the like are formed under the conductive film 314 or the conductive material 386 in the opening 313, the insulating film 310 and the insulating film 303 are removed at the same time as the thinning treatment of the first substrate 301A.

If a glass substrate is used as the first substrate 301A, chemical etching can be performed using a drug solution containing hydrofluoric acid.

FIG. 13B shows a state in which the thinning treatment of the first substrate 301A is completed. Through the thinning treatment, the thickness of the first substrate is reduced to be a substrate 401B, and the depth of the groove 420A that is formed on the other surface of the first substrate is reduced to be a groove 420B.

Although the cross section of the groove 420B after the thinning treatment of the substrate has a rectangular shape in FIG. 13B, it is not particularly limited to this shape. Similarly to the cross section of the groove 420A before the thinning treatment of the substrate, the cross section of the groove 420B may have a U shape or a wedge shape, or a side surface of the groove 420B may have a tapered shape.

The thickness of the first substrate 401B after the thinning treatment is 100 µm or less, preferably 50 µm or less, and more preferably 30 µm or less. When the thickness of the first substrate 401B is 100 µm or less, the first substrate 401B has flexibility; therefore, a flexible integrated circuit device can be obtained finally. In addition, since the first substrate 401B functions as a protective film to maintain the durability of the integrated circuit device and to prevent impurity elements, moisture, and the like from entering the elements of the integrated circuit, the thickness of the first substrate 401B is 1 µm or more, preferably 2 µm or more, and more preferably 4 µm or more.

What is formed on the other surface of the first substrate 401B is not limited to the groove as long as the surface area of the other surface of the first substrate 401B increases.

Although not shown, the groove 420B is filled with a heat sink material or a film containing a heat sink material is formed at least over the surface of the groove 420B, similarly to Embodiment Mode 1.

In this manner, when the groove 420B as a depressed portion is formed on the other surface of the first substrate 401B and the groove 420B is filled with a heat sink material or a film containing a heat sink material is formed at least over the surface of the groove 420B, the other surface of the first substrate 401B can have a larger surface area and higher heat dissipation properties; thus, heat generated from the integrated circuit can be easily dissipated.

Figure 13C:
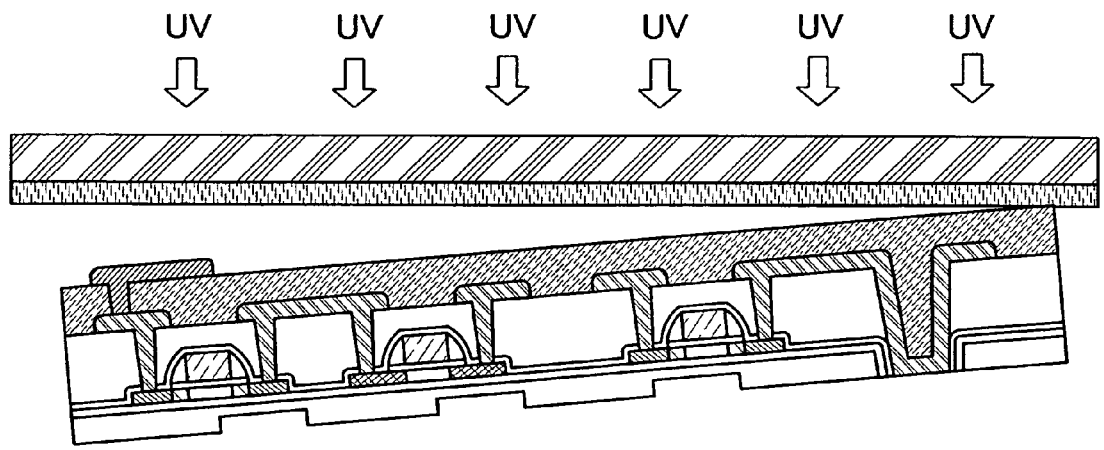

Then, as shown in FIG. 13C, the UV (ultraviolet) separating film 417 is irradiated with UV (ultraviolet) in order to separate the UV (ultraviolet) separating film 417 that is attached onto the insulating film 315 and the electrode 416. By this UV (ultraviolet) irradiation, the adhesion of the adhesive layer 418 in the UV separating film 417 is reduced, and thus the UV separating film 417 can be separated.

If a thermal separating film is used instead of the UV separating film or a second substrate is attached onto the insulating film 315 and the electrode 416 with a thermal separating adhesive, a heat treatment is performed instead of UV (ultraviolet) irradiation. By the heat treatment, the adhesion of an adhesive layer in the thermal separating film or the adhesion of the thermal separating adhesive is reduced, and thus the thermal separating film or the second substrate can be separated.

Figure 14:
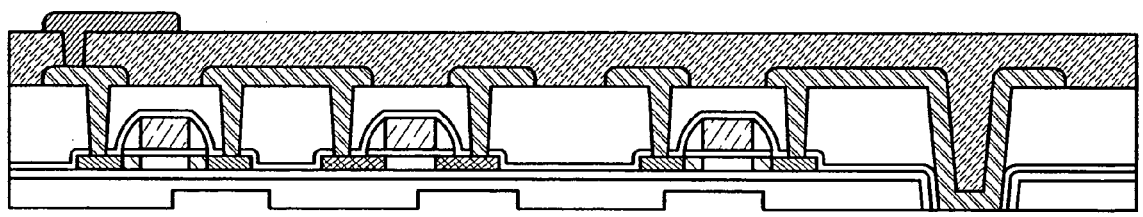
FIG. 14 is a cross sectional view showing Embodiment Mode 4.

Through the aforementioned steps, the integrated circuit device shown in FIG. 14 can be obtained.

Although FIGS. 12A to 14 show the example in which the thin film transistors are formed over the first substrate, the invention is not limited to this. As an element of the integrated circuit, a field effect transistor (FET) may be provided using a semiconductor substrate such as a Si substrate as a channel, or an organic thin film transistor (TFT) using an organic material as a channel may be provided.

In addition, the structure of the thin film transistors included in the semiconductor device of the invention is not limited to the aforementioned one. The thin film transistors may have the structure described in Embodiment Mode 2.

The heat sink material is not necessarily made of one kind of material, and two or more kinds of materials may be stacked or two or more kinds of materials may be formed in different places.

The structure shown in this embodiment mode can be implemented in combination with other embodiment modes and embodiments.

Embodiment Mode 5

Described in this embodiment mode is a case in which a plurality of integrated circuit devices are stacked and integrated circuits formed over different substrates are electrically connected to each other.

Figure 15:
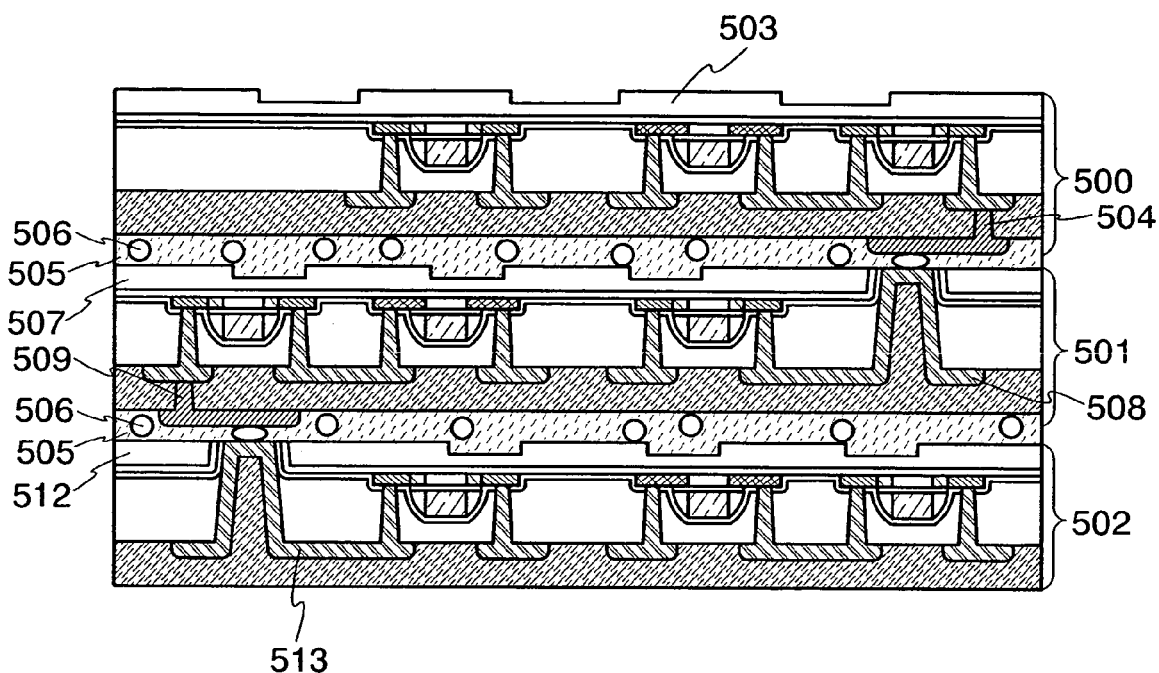
FIG. 15 is a cross sectional view showing Embodiment Mode 5.

FIG. 15 is a cross sectional view of an integrated circuit device of this embodiment mode. Integrated circuit devices 500, 501, and 502 each including an integrated circuit formed over a surface are stacked.

The integrated circuit device 500 is an integrated circuit device that is manufactured by the method described in Embodiment Mode 2. In the integrated circuit device 500, an integrated circuit including a thin film transistor is formed over a surface of a first substrate 503, and a groove as a depressed portion is formed on a surface of the first substrate 503, over which the integrated circuit is not formed (hereinafter referred to as the other surface of the first substrate 503). Although not shown, the groove is filled with a heat sink material or a film containing a heat sink material is formed at least over the surface of the groove, similarly to Embodiment Mode 1. Further, in the integrated circuit device 500, an electrode 504 is formed over the integrated circuit so as to be electrically connected to the thin film transistor of the integrated circuit.

The integrated circuit device 501 is an integrated circuit device that is manufactured by the method described in Embodiment Mode 4. In the integrated circuit device 501, an integrated circuit including a thin film transistor is formed over a surface of a second substrate 507, and a groove as a depressed portion is formed on a surface of the second substrate 507, over which the integrated circuit is not formed (hereinafter referred to as the other surface of the second substrate 507). Although not shown, the groove is filled with a heat sink material or a film containing a heat sink material is formed at least over the surface of the groove, similarly to Embodiment Mode 1. Further, in the integrated circuit device 501, an electrode 509 is formed over the integrated circuit so as to be electrically connected to the thin film transistor of the integrated circuit. The integrated circuit device 501 also includes an electrode 508 over the other surface of the second substrate 507, which can be electrically connected to the thin film transistor of the integrated circuit.

The integrated circuit device 502 is an integrated circuit device that is manufactured by the method described in Embodiment Mode 3. In the integrated circuit device 502, an integrated circuit including a thin film transistor is formed over a surface of a third substrate 512, and a groove as a depressed portion is formed on a surface of the third substrate 512, over which the integrated circuit is not formed (hereinafter referred to as the other surface of the third substrate 512). Although not shown, the groove is filled with a heat sink material or a film containing a heat sink material is formed at least over the surface of the groove, similarly to Embodiment Mode 1. Further, the integrated circuit device 502 includes an electrode 513 over the other surface of the third substrate 512, which can be electrically connected to the thin film transistor of the integrated circuit.

The integrated circuit devices 500, 501, and 502 having the aforementioned structures are provided to be stacked. At this time, the integrated circuit devices 500, 501, and 502 are provided so that the electrode 504 of the integrated circuit device 500 faces the electrode 508 of the integrated circuit device 501, and the electrode 509 of the integrated circuit device 501 faces the electrode 513 of the integrated circuit device 502.

Then, the integrated circuit device 500 is attached to the integrated circuit device 501 with an anisotropic conductive adhesive 505 or the like, and the integrated circuit device 501 is attached to the integrated circuit device 502 with the anisotropic conductive adhesive 505 or the like. The anisotropic conductive adhesive 505 is an adhesive including a conductive particle 506. Thus, when the integrated circuit device 500 and the integrated circuit device 501, and the integrated circuit device 501 and the integrated circuit device 502 are attached to each other with the anisotropic conductive adhesive 505, the electrode 504 of the integrated circuit device 500 is electrically connected to the electrode 508 of the integrated circuit device 501 through the conductive particle 506, and the electrode 509 of the integrated circuit device 501 is electrically connected to the electrode 513 of the integrated circuit device 502 through the conductive particle 506.

In other words, the integrated circuit provided in the integrated circuit device 500 is electrically connected to the integrated circuit provided in the integrated circuit device 501, and the integrated circuit provided in the integrated circuit device 501 is electrically connected to the integrated circuit provided in the integrated circuit device 502.

As the anisotropic conductive adhesive 505, for example, an anisotropic conductive paste (ACP) or the like can be given. In addition, the attachment of the integrated circuit devices 500, 501, and 502 is not necessarily performed with the anisotropic conductive adhesive 505. The attachment may be performed in other ways as long as the electrode 504 and the electrode 508, and the electrode 509 and the electrode 513 can be electrically connected to each other, and the integrated circuit devices 500, 501, and 502 can be attached to each other. Accordingly, the attachment may be performed using, for example, a conductive adhesive such as silver paste, copper paste, and carbon paste, a conductive film such as an anisotropic conductive film (ACF), a non-conductive paste (NCP), solder joint, or the like.

Note that the attachment of the integrated circuit devices 500, 501, and 502 is preferably performed using a material with high heat dissipation properties, namely, a material with high thermal conductivity, such as the anisotropic conductive adhesive 505.

In this manner, when a plurality of integrated circuit devices are provided in a multilayer structure, high integration and miniaturization are achieved even if the plurality of integrated circuit devices are electrically connected to each other. On the other hand, a problem occurs in that heat generated from an integrated circuit in each of the integrated circuit devices is easily accumulated. However, a depressed portion is formed on the substrate of each of the integrated circuit devices, and the depressed portion is filled with a heat sink material or a film containing a heat sink material is formed at least over the surface of the depressed portion. Therefore, the surface area of the substrate of each of the integrated circuit devices increases and the heat dissipation properties thereof increase due to the heat sink material; thus, heat generated from the integrated circuit can be easily dissipated. As a result, problems caused by accumulation of heat generated from the integrated circuits can be solved.

In FIG. 15, the integrated circuit devices 500, 501, and 502 are attached to each other by forming the anisotropic conductive adhesive over the entire surface. However, the anisotropic conductive adhesive is only required to be formed in a position where different substrates are electrically connected to each other. An example of such an attachment is shown in FIG. 26.

Figure 26:
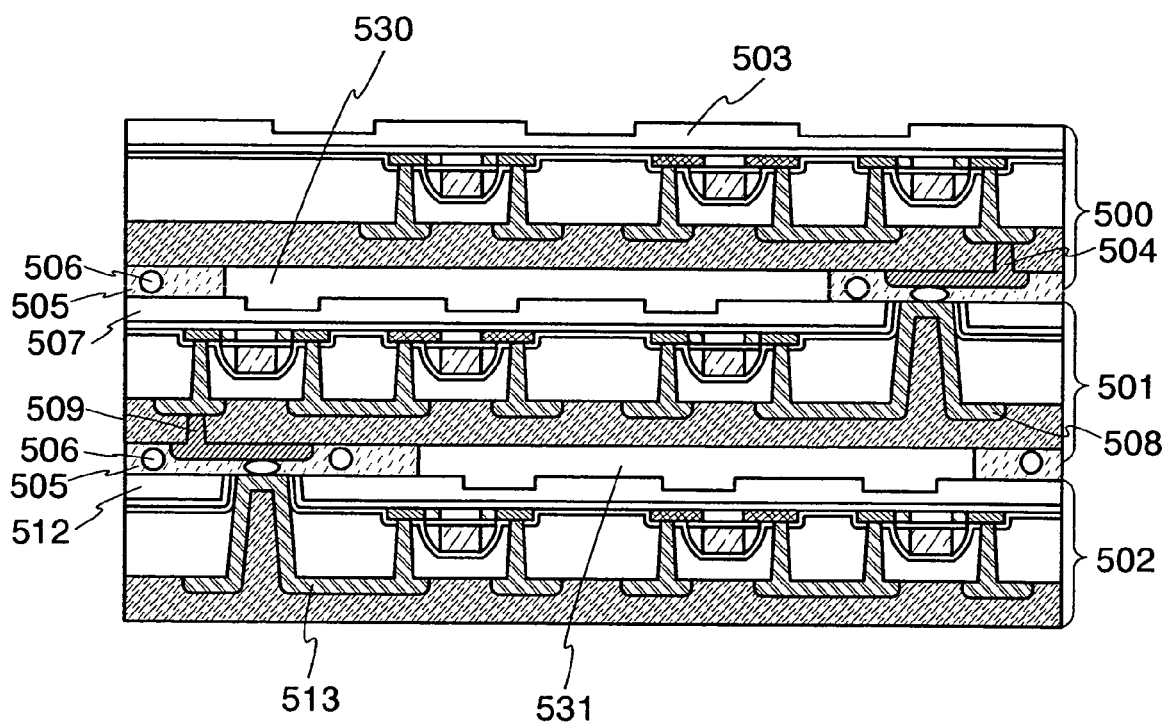
FIG. 26 is a cross sectional view showing Embodiment Mode 5.

In FIG. 26, the anisotropic conductive adhesive 505 is formed in a position where the electrode 504 of the integrated circuit device 500 is electrically connected to the electrode 508 of the integrated circuit device 501, and in a position where the electrode 509 of the integrated circuit device 501 is electrically connected to the electrode 513 of the integrated circuit device 502. The anisotropic conductive adhesive is not formed over the depressed portion of the substrate 507 of the integrated circuit device 501 and over the depressed portion of the substrate 512 of the integrated circuit device 502. Accordingly, in such portions, a space is formed between the integrated circuit devices 500 and 501, and between the integrated circuit devices 501 and 502. In this manner, in the portions including the depressed portions of the substrates 507 and 512, spaces 530 and 531 are formed between the integrated circuit devices 500 and 501 and between the integrated circuit devices 501 and 502, respectively. Thus, heat can be dissipated from the integrated circuit devices through these spaces 530 and 531. Note that it is preferable that gas be forced to flow through the spaces 530 and 531 because heat dissipation properties can be further improved.

Figure 27:
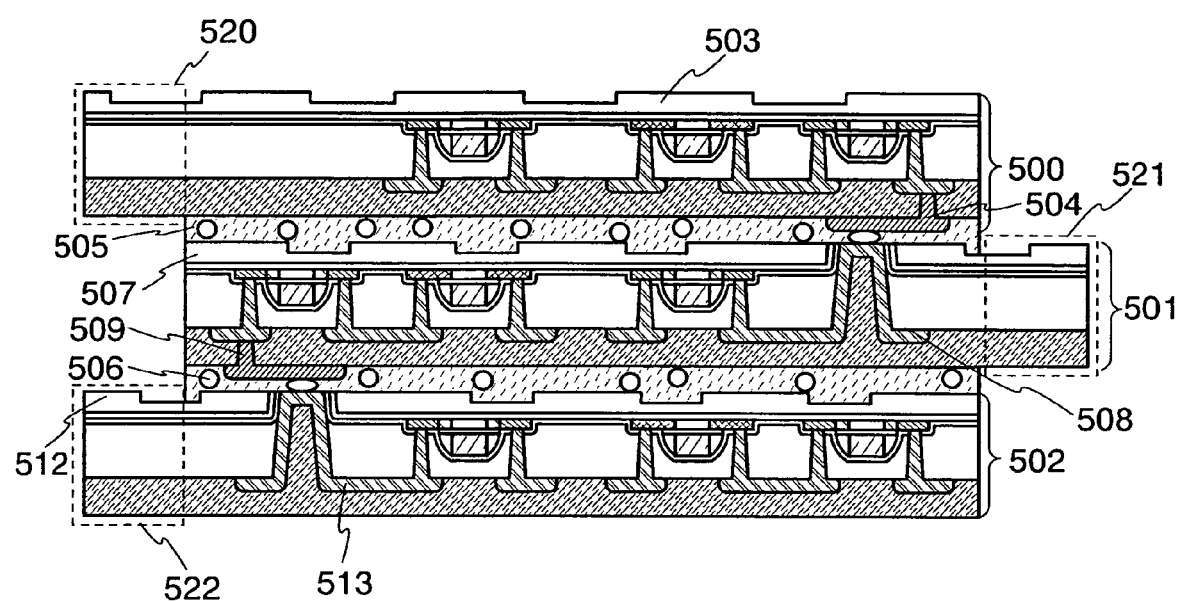
FIG. 27 is a cross sectional view showing Embodiment Mode 5.

Moreover, as shown in FIG. 27, heat dissipating portions 520, 521, and 522 may be formed by attaching the integrated circuit devices 500, 501, and 502 so that the portions thereof, over which the integrated circuit is not formed, overhang one another.

The heat dissipating portions 520, 521, and 522 allow heat generated from the integrated circuit included in each integrated circuit device to be dissipated from the heat dissipating portions 520, 521, and 522. Accordingly, heat can be dissipated around the integrated circuit devices more effectively as compared to the structure shown in FIG. 26. In addition, depressed portions are also formed on the substrates 503, 507, and 512 in the heat dissipating portions 520, 521, and 522; therefore, the heat dissipation portions have a larger surface area, and thus higher heat dissipation properties as compared to the case in which the depressed portion is not formed in the heat dissipation portions 520, 521, and 522.

If four or more integrated circuit devices are stacked, similarly to FIG. 27, dissipation portions may be formed at the end of each of the stacked integrated circuit devices by attaching the integrated circuit devices so as to overhang one another.

Further, when the thinning treatment is applied to the substrates 503, 507, and 512 so that each substrate has a thickness of, for example, 100 μm or less, the heat dissipation properties from the heat dissipation portions 520, 521, and 522 are higher than the case in which the thinning treatment of the substrates is not performed.

Figure 28:
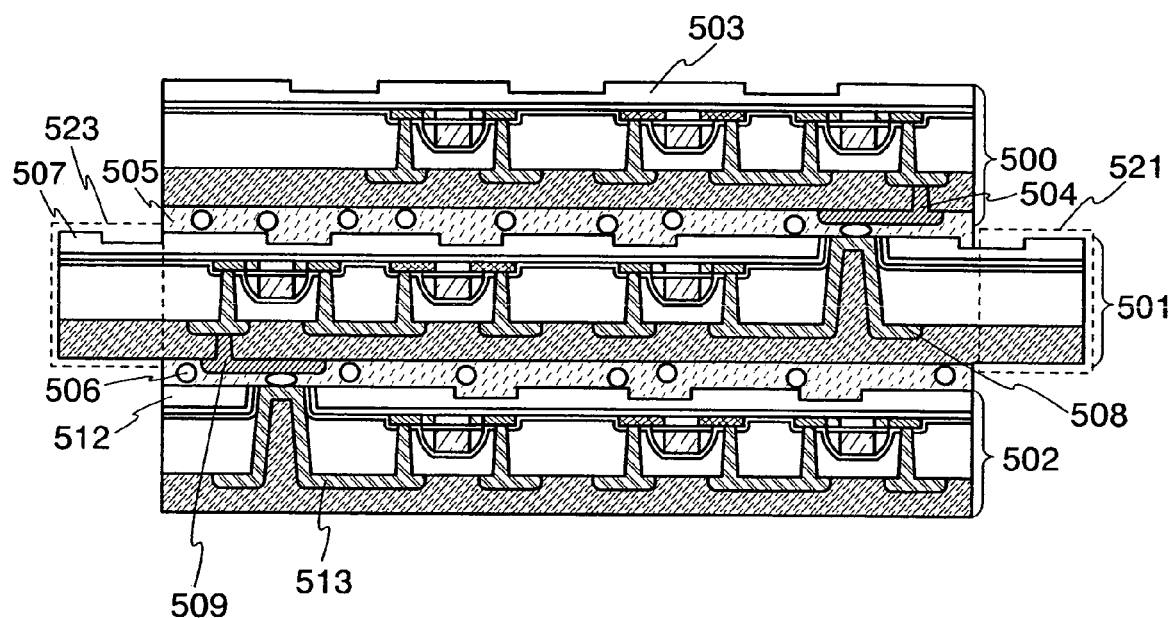
FIG. 28 is a cross sectional view showing Embodiment Mode 5.

The heat dissipation portion is not necessarily provided in each integrated circuit device as shown in FIG. 27. For example, in FIG. 27, only the heat dissipation portion 521 may be formed without providing the heat dissipation portions 520 and 522. When integrated circuit devices are stacked, it is the hardest to dissipate heat generated from an integrated circuit included in an integrated circuit device that is located innermost among the stacked integrated circuit devices. That is to say, in FIG. 27, it is the hardest to dissipate heat generated from the integrated circuit included in the integrated circuit device 501 that is located between the integrated circuit devices 500 and 502. Accordingly, the heat dissipation portion 521 in the integrated circuit device 501 allows heat generated from the integrated circuit included in the integrated circuit device 501 to be dissipated effectively. In order to further increase the heat dissipation properties of the integrated circuit device 501, a heat dissipation portion 523 may be additionally provided in the integrated circuit device 501 as shown in FIG. 28.

Note that if three or more integrated circuit devices are stacked, a substrate that includes a heat dissipation portion and a substrate that does not include a heat dissipation portion may be alternately stacked to be attached to each other. In other words, substrates may be stacked in such a manner that a substrate that does not include a heat dissipation portion is provided over a substrate that includes a heat dissipation portion, and another substrate that includes a heat dissipation portion is formed thereover. At that time, the substrate that includes a heat dissipation portion may have only the heat dissipation portion 521 as in the integrated circuit device 501 shown in FIG. 27, or the heat dissipation portions 521 and 523 as in the integrated circuit device 501 shown in FIG. 28.

In FIG. 27, the heat dissipation portions 521 and 522 may be formed without providing the heat dissipation portion 520. Since the integrated circuit device 500 is located outermost among the stacked integrated circuit devices and a depressed portion is formed on the substrate 503, the surface of the substrate 503 has high heat dissipation properties. Therefore, heat generated from the integrated circuit included in the integrated circuit device 500 is effectively dissipated from the surface of the substrate 503, on which the depressed portion is formed. Thus, the heat dissipation portions 521 and 522 may be formed in the integrated circuit devices 501 and 502 in order to increase the heat dissipation properties of the integrated circuit devices 501 and 502.

Although the three integrated circuit devices are stacked in a multilayer structure in the above description, the number of stacked integrated circuit devices is not limited to three, and two or more integrated circuit devices may be stacked. Each of the structures described in FIGS. 26 to 28 can be appropriately applied to any case in which two or more integrated circuit devices are stacked.

In this embodiment mode, the integrated circuits manufactured by the methods described in Embodiment Modes 2 to 4 are stacked in a multilayer structure. However, the structure and manufacturing method of each of the stacked integrated circuit devices are not limited to those described in Embodiment Modes 2 to 4. Any structure may be adopted as long as integrated circuits included in adjacent integrated circuit devices can be electrically connected to each other.

Since integrated circuit devices are stacked in a multilayer structure in this embodiment mode, heat generated from an integrated circuit included in each of the integrated circuit devices is easily accumulated. When a groove (depressed portion) is filled with a heat sink material or a film containing a heat sink material is formed at least over the surface of the groove (depressed portion), heat can be easily dissipated around an integrated circuit device. Accordingly, the invention is effective particularly when integrated circuit devices are stacked in a multilayer structure as in this embodiment mode.

The heat sink material is not necessarily made of one kind of material, and two or more kinds of materials may be stacked or two or more kinds of materials may be formed in different places.

In the case of the structure including a heat dissipation portion (e.g., structures shown in FIGS. 27 and 28), if enough heat dissipation properties are obtained by providing the heat dissipation portion, a groove (depressed portion) is not necessarily filled with a heat sink material and a film containing a heat sink material is not necessarily formed at least over the surface of the groove (depressed portion).

The substrate of each of the stacked integrated circuit devices is preferably subjected to the thinning treatment. Since the thickness of the substrate is reduced by the thinning treatment, the device can be miniaturized as compared to the case in which the thinning treatment of the substrate is not performed. In particular, when the integrated circuit devices are stacked, it is important to reduce the thickness of the substrate of each of the stacked integrated circuit devices because the thickness of the whole device is significantly influenced by the thickness of the substrate of each of the stacked integrated circuit devices. The substrate of each of the stacked integrated circuit devices has a thickness of 100 µm or less, preferably 50 µm or less, and more preferably 30 µm or less. In addition, since the substrate of each of the stacked integrated circuit devices functions as a protective film to maintain the durability of the integrated circuit devices and to prevent impurity elements, moisture, and the like from entering the elements of the integrated circuits, the thickness of the substrate is 1 µm or more, preferably 2 µm or more, and more preferably 4 µm or more.

The structure shown in this embodiment mode can be implemented in combination with other embodiment modes and embodiments.

Embodiment 1

Described in this embodiment is a case in which the integrated circuit device of the invention is applied to a semiconductor device such as an IC.

Figure 16A:
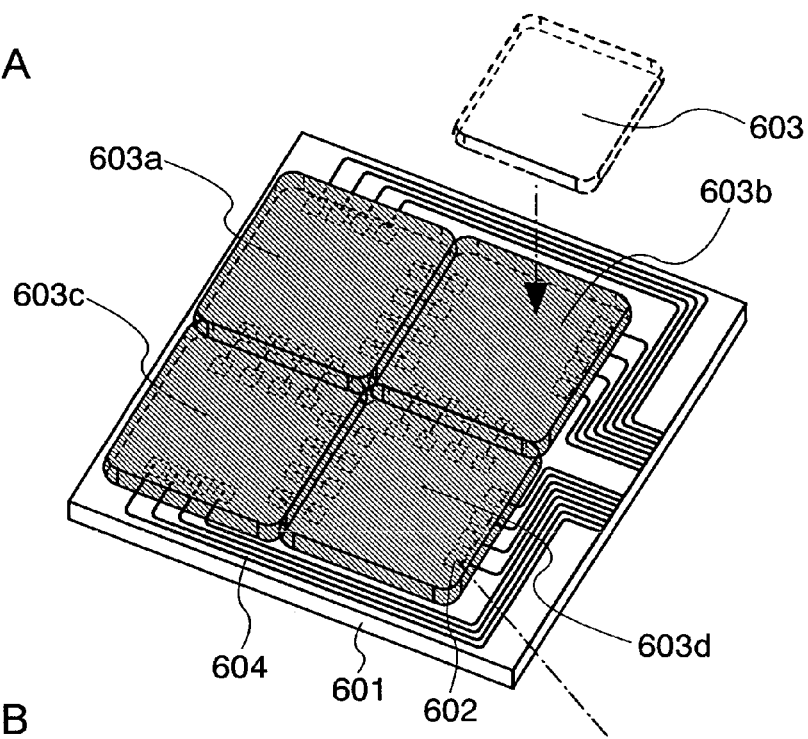
FIG. 16A is a perspective view and FIGS. 16B and 16C are cross sectional views showing Embodiment 1.
Figure 16B:
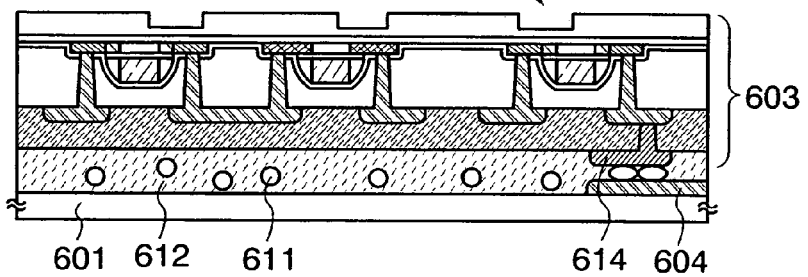

In a semiconductor device shown in FIG. 16A, an integrated circuit device 603 having any one of the structures described in the aforementioned embodiment modes is attached onto a substrate 601 including a conductive film 604. In this embodiment, a plurality of integrated circuit devices 603a to 603d are formed over the substrate 601 so as to be electrically connected to the conductive film 604. The integrated circuit devices 603a to 603d can be attached to the substrate 601 with an anisotropic conductive adhesive 612, and integrated circuits included in the integrated circuit devices 603a to 603d can be electrically connected to the conductive film 604 through a conductive particle 611 contained in the anisotropic adhesive 612. As the anisotropic conductive adhesive 612, for example, an anisotropic conductive paste (ACP) or the like can be given. Alternatively, the integrated circuit devices 603a to 603d may be electrically connected to the conductive film 604 with a conductive adhesive such as silver paste, copper paste, and carbon paste, a conductive film such as an anisotropic conductive film (ACF), a non-conductive paste (NCP), solder joint, or the like.

Each of the integrated circuit devices 603a to 603d functions as one or more of a central processing unit (CPU), a memory, a network processing circuit, a disk processing circuit, an image processing circuit, a sound processing circuit, a power supply circuit, a temperature sensor, a humidity sensor, an infrared sensor, and the like.

Figure 16C:
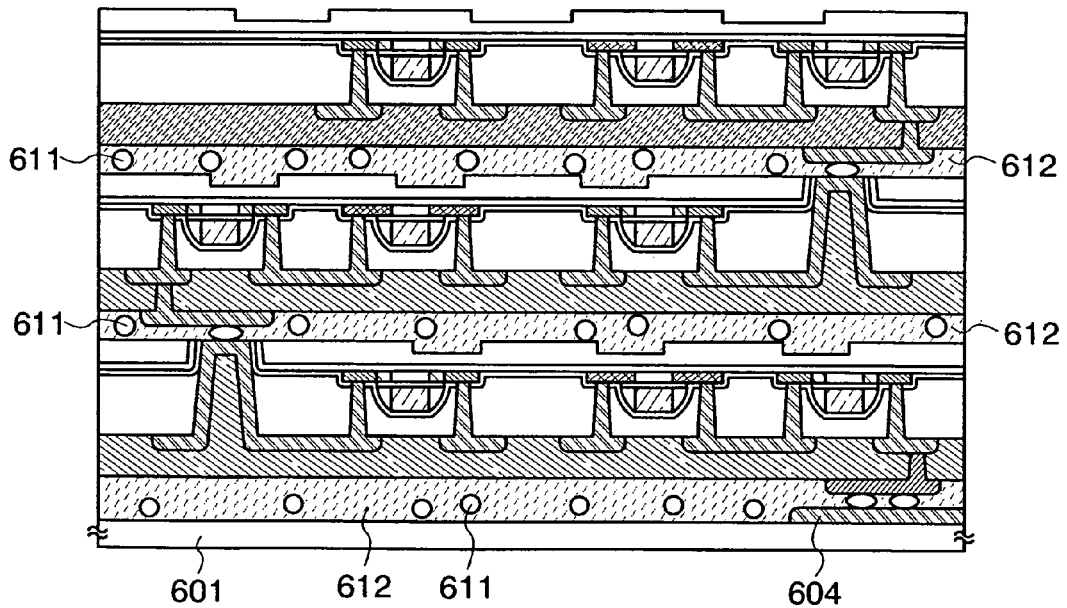

As shown in FIG. 16C, a plurality of integrated circuit devices 603 may be stacked in a multilayer structure. When the plurality of integrated circuit devices are thus stacked in a multilayer structure, high integration and miniaturization are achieved even if the plurality of integrated circuit devices are electrically connected to each other. In addition, a depressed portion is formed on the substrate of each of the integrated circuit devices, and the depressed portion is filled with a heat sink material or a film containing a heat sink material is formed at least over the surface of the depressed portion. As a result, heat generated from the integrated circuits can be easily dissipated.

Embodiment 2

Described in this embodiment is a case in which the integrated circuit device of the invention is applied to a peripheral driver circuit of a display device.

A display device including a light emitting element in a pixel portion is described with reference to FIGS. 18A and 18B. FIG. 18A is a top view showing an example of a display device, and FIG. 18B is a cross sectional view along a line a-b and a line c-d of FIG. 18A.

The display device shown in FIG. 18A includes a scan line driver circuit 802, a signal line driver circuit 803, a pixel portion 804, and the like that are formed over a substrate 801. A counter substrate 806 is provided so as to face a surface of the substrate 801, over which the pixel portion 804 is formed. The scan line driver circuit 802 and the signal line driver circuit 803 each include an integrated circuit device over the substrate 801, which has any one of the structures described in the aforementioned embodiment modes. The substrate 801 is attached to the counter substrate 806 with a sealing member 805.

The scan line driver circuit 802 and the signal line driver circuit 803 receive a video signal, a clock signal, a start signal, a reset signal, and the like from an FPC (Flexible Printed Circuit) 807 that is an external input terminal. Although only the FPC is shown in the drawings, a printed wiring board may be attached to the FPC. In addition, the signal line driver circuit 803 or the scan line driver circuit 802 may adopt a structure in which the integrated circuit devices of the invention are stacked as described in the aforementioned embodiment modes. When thin film transistors are stacked, an area occupied by the signal line drive circuit 803 or the scan line driver circuit 802 can be reduced, leading to an increase in the area of the pixel portion 804.

FIG. 18B is a cross sectional schematic view along the line a-b and the line c-d of FIG. 18A, which shows the signal line driver circuit 803 and the pixel portion 804 each including a thin film transistor formed over the substrate 801. As a part of the signal line driver circuit 803, a CMOS circuit is formed by combing an N-channel thin film transistor 810a and a P-channel thin film transistor 810b. Further, an integrated circuit device 819 having a thin film transistor 810c is provided over the thin film transistors 810a and 810b. An electrode 821 that is electrically connected to the thin film transistor 810c included in the integrated circuit device 819 and an electrode 820 that is electrically connected to the thin film transistor 810b are electrically connected to each other through a conductive particle 823 contained in an anisotropic conductive adhesive 822. In other words, the CMOS circuit including the thin film transistor 810a and the thin film transistor 810b and the thin film transistor 810c are electrically connected to each other through the electrodes 820 and 821 and the conductive particle 823.

As the anisotropic conductive adhesive 822, for example, an anisotropic conductive paste (ACP) or the like can be given. Alternatively, the electrode 820 and the electrode 821 may be electrically connected to each other not only with the anisotropic conductive adhesive 822, but also with a conductive adhesive such as silver paste, copper paste, and carbon paste, a conductive film such as an anisotropic conductive film (ACF), a non-conductive paste (NCP), solder joint, or the like.

FIG. 18B shows only the cross sectional view of the signal line driver circuit 803. However, the scan line driver circuit 802 can also adopt a structure which includes circuits formed over the substrate 801 and the integrated circuit device of the invention, similarly to the signal line driver circuit 803.

Driver circuits such as the scan line driver circuit 802 and the signal line driver circuit 803 may be constituted by a known CMOS circuit, PMOS circuit, or NMOS circuit instead of a thin film transistor. In addition, this embodiment shows the case in which the driver circuits such as the scan line driver circuit 802 and the signal line driver circuit 803 each include circuits formed over the substrate 801 and the integrated circuit device of the invention. However, the invention is not limited to this case. The driver circuits such as the scan line driver circuit 802 and the signal line driver circuit 803 may include only the integrated circuit device of the invention.

The pixel portion 804 includes a plurality of pixels each having a light emitting element 816 and a thin film transistor 811 for driving the light emitting element 816. A first electrode 813 of the light emitting element 816 is provided so as to be connected to an electrode 812 that is connected to a source region or a drain region of the thin film transistor 811, and an insulating film 809 is formed so as to cover the end of the first electrode 813. The insulating film 809 functions as a partition wall between a plurality of pixels.

The insulating film 809 is formed of a positive photosensitive acrylic resin film. The insulating film 809 is formed to have a curved surface at an upper end portion or a lower end portion thereof in order to improve the coverage. For example, if positive photosensitive acrylic is used as a material for the insulating film 809, the insulating film 809 is preferably formed to have a curved surface with a curvature radius (0.2 to 3 µm) only at the upper end portion. The insulating film 809 may be formed of either a negative photosensitive resin which becomes insoluble in an etchant by light exposure or a positive photosensitive resin which becomes soluble in an etchant by light exposure. Alternatively, the insulating film 809 may be formed to have a single layer structure or a stacked layer structure of an organic material such as epoxy, polyimide, polyamide, polyvinylphenol, and benzocyclobutene, or a siloxane material such as siloxane resin. As described in the above embodiment modes, the surface of the insulating film 809 can be modified to obtain a dense film by applying a plasma treatment to the insulating film 809 to oxidize or nitride the insulating film 809. By modifying the surface of the insulating film 809, the strength of the insulating film 809 can be improved, which results in reduction in physical damages such as crack generation at the time of forming an opening or the like and film reduction at the time of etching. In addition, modification of the surface of the insulating film 809 leads to improvement in interface properties such adhesiveness with a light emitting layer 814 provided over the insulating film 809.

In the semiconductor device shown in FIGS. 18A and 18B, the light emitting layer 814 is formed over the first electrode 813 of the light emitting element 816, and a second electrode 815 of the light emitting element 816 is formed over the light emitting layer 814. The light emitting element 816 is formed by stacking the first electrode 813, the light emitting layer 814, and the second electrode 815.

One of the first electrode 813 and the second electrode 815 of the light emitting element 816 functions as an anode and the other functions as a cathode.

The anode is preferably made of a material having a high work function. For example, the anode may be formed of a single layer film such as an indium tin oxide (ITO) film, an indium tin oxide film containing silicon, a transparent conductive film made of an indium oxide-zinc oxide alloy in which indium oxide is mixed with zinc oxide (ZnO) of 2 to 20 atomic %, a zinc oxide (ZnO) film, a titanium nitride film, a chromium film, a tungsten film, a Zn film, and a Pt film, as well as a stacked layer film of a titanium nitride film and a film mainly containing aluminum, a three-layer film of a titanium nitride film, a film mainly containing aluminum, and a titanium nitride film, or the like. When a stacked layer structure is employed, the electrode can have low resistance as a wire and form a favorable ohmic contact. Further, the electrode can function as an anode. Note that the indium oxide-zinc oxide alloy is formed by sputtering using a target in which indium oxide is mixed with zinc oxide (ZnO).

The cathode is preferably made of a material having a low work function (Al, Ag, Li, Ca, or an alloy thereof such as MgAg, MgIn, AlLi, $CaF_2$, and calcium nitride). When a light transmissive electrode is used as the cathode, it is preferable to use a stacked film of a metal thin film and a transparent conductive film (ITO, ITO containing silicon, a transparent conductive film made of an indium oxide-zinc oxide alloy in which indium oxide is mixed with zinc oxide (ZnO) of 2 to 20 atomic %, zinc oxide (ZnO), or the like).

In this embodiment, the first electrode 813 of the light emitting element 816 is made of light transmissive ITO to be used as the anode, and light is extracted from the substrate 801 side. Note that light may be extracted from the counter substrate 806 side by using a light transmissive material for the second electrode 815 of the light emitting element 816. Alternatively, light may be extracted from both the substrate 801 side and the counter substrate 806 side by using a light transmissive material for the first electrode 813 and the second electrode 815 of the light emitting element 816.

The light emitting layer 814 can be formed by a known method such as evaporation using an evaporation mask, ink jet printing, and spin coating so as to have a single layer structure or a stacked layer structure of a low molecular material, an intermediate molecular material (including an oligomer and a dendrimer), or a high molecular material (also referred to as a polymer).

In this embodiment, the counter substrate 806 is attached to the substrate 801 with the sealing member 805, thereby the light emitting element 816 is provided in a space 808 surrounded by the substrate 801, the counter substrate 806, and the sealing member 805. Note that the space 808 may be filled with an inert gas (such as nitrogen and argon) or the sealing member 805.

Note that the sealing member 805 is preferably made of an epoxy-based resin. The material desirably allows as little moisture and oxygen as possible to penetrate. The counter substrate 806 may be a glass substrate, a quartz substrate, or a plastic substrate made of FRP (Fiberglass-Reinforced Plastics), PVF (polyvinyl fluoride), Myler, polyester, acrylic, or the like.

The display device is not limited to the aforementioned structure including the light emitting element in the pixel portion, and may have a structure including liquid crystal in the pixel portion.

Although the driver circuits such as the scan line driver circuit and the signal line driver circuit are formed in the space 808 surrounded by the substrate 801, the counter substrate 806, and the sealing member 805 in FIGS. 18A and 18B, the driver circuits may be formed outside of the space 808 surrounded by the substrate 801, the counter substrate 806, and the sealing member 805.

In FIGS. 18A and 18B, the driver circuits such as the scan line driver circuit and the signal line driver circuit are formed over the same substrate as the pixel portion. However, the invention is not limited to this structure, and the integrated circuit device of the invention may be attached to the substrate.

Figure 17A:
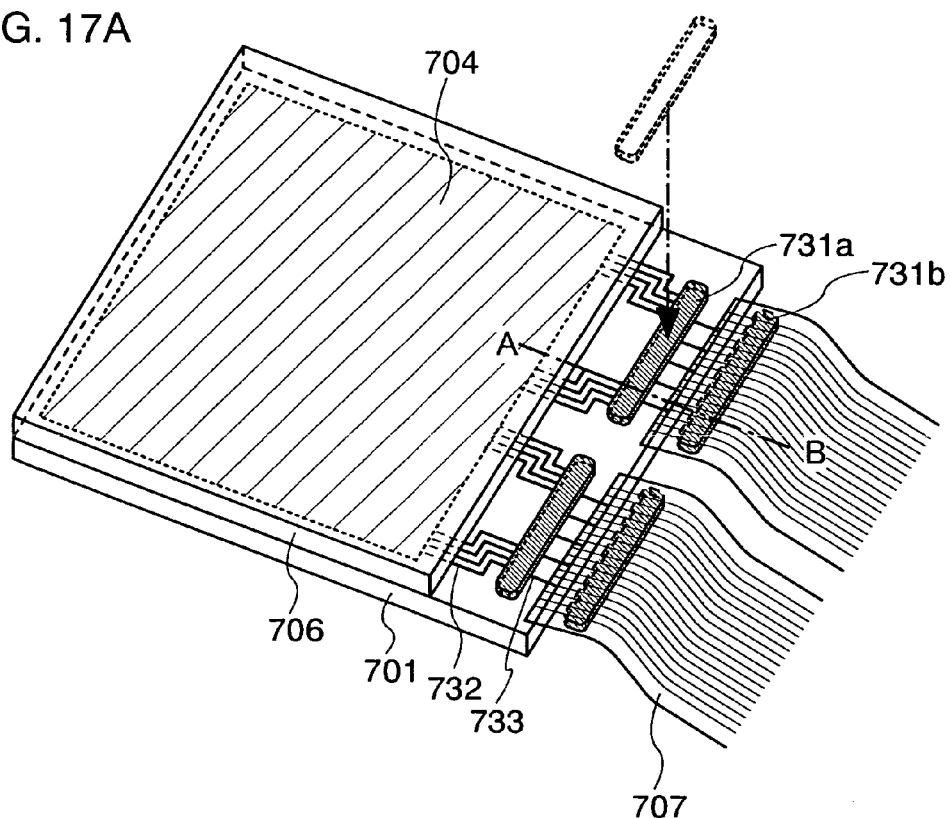
FIG. 17A is a perspective view and FIG. 17B is a cross sectional view showing Embodiment 1.
Figure 17B:
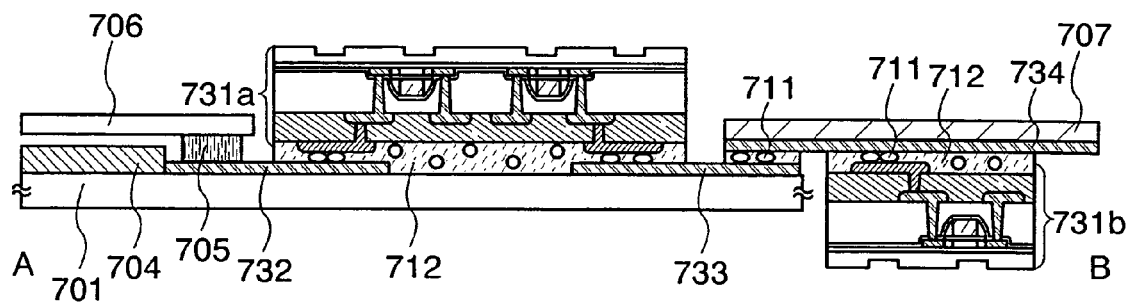

An example of a display device in such a case is described with reference to FIGS. 17A and 17B. FIG. 17B is a cross sectional schematic view along a line A-B of FIG. 17A.

An integrated circuit device 731a including a thin film transistor is attached onto a substrate 701, and an integrated circuit device 731b including a thin film transistor is attached onto an FPC 707 functioning as a connection film. The attachment of the substrate 701 and the integrated circuit device 731a, and the attachment of the FPC 707 and the integrated circuit device 731b are performed using an anisotropic conductive adhesive 712 containing a conductive particle 711. When the integrated circuit device 731a is attached onto the substrate 701 with the anisotropic conductive adhesive 712, the integrated circuit device 731a is connected to a pixel portion 704 through a conductive film 732 over the substrate 701 and the conductive particle 711. Further, when the integrated circuit device 731b is attached onto the FPC 707 with the anisotropic conductive adhesive 712, the integrated circuit device 731b is connected to the integrated circuit device 731a through a conductive film 733 over the substrate 701, a conductive film 734 over the FPC 707, and the conductive particle 711. As the anisotropic conductive adhesive 712, for example, ACP or the like can be given. Alternatively, it is also possible to use a conductive adhesive such as silver paste, copper paste, and carbon paste, a conductive film such as an ACF, an NCP, solder joint, or the like as set forth above. The substrate 701 is attached to a substrate 706 with a sealing member 705.

Next, applications of the aforementioned display device are described with reference to the drawings.

The aforementioned display device can be applied to electronic apparatuses such as a camera such as a video camera and a digital camera, a goggle type display (head mounted display), a navigation system, a sound reproducing device (car audio system, audio component set, or the like), a computer, a game machine, a portable information terminal (mobile computer, mobile phone, portable game machine, electronic book, or the like), and an image reproducing device provided with a recording medium (specifically, a device that reproduces a recording medium such as a DVD (Digital Versatile Disc) and has a display for displaying the reproduced image). Specific examples of them are described below.

Figure 23A:
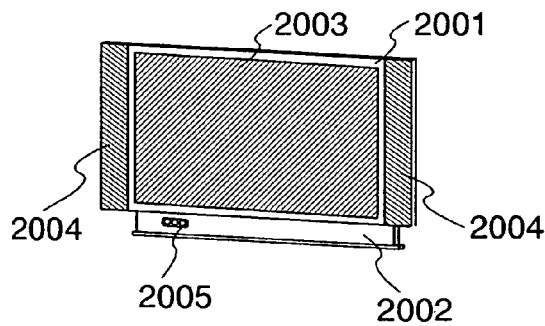
FIGS. 23A to 23G show electronic apparatuses each having a display portion to which the integrated circuit device of the invention is applied.

FIG. 23A shows a television receiver that includes a housing 2001, a supporting base 2002, a display portion 2003, speaker portions 2004, a video input terminal 2005, and the like. The television receiver can be manufactured by applying the display device of this embodiment to the display portion 2003.

Figure 23B:
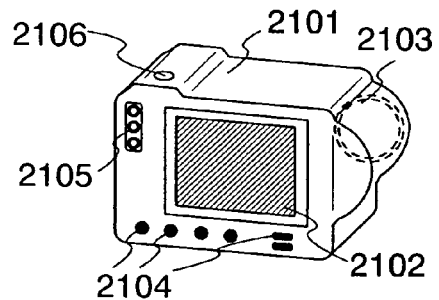

FIG. 23B shows a digital camera that includes a main body 2101, a display portion 2102, an image receiving portion 2103, operating keys 2104, an external connecting port 2105, a shutter 2106, and the like. The digital camera can be manufactured by applying the display device of this embodiment to the display portion 2102.

Figure 23C:
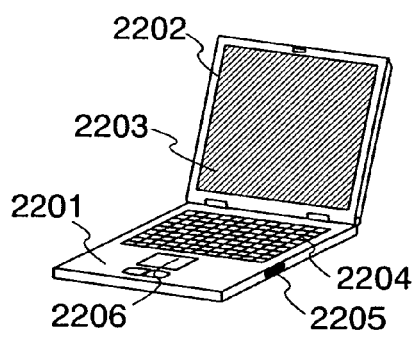

FIG. 23C shows a computer that includes a main body 2201, a housing 2202, a display portion 2203, a keyboard 2204, an external connecting port 2205, a pointing mouse 2206, and the like. The computer can be manufactured by applying the display device of this embodiment to the display portion 2203.

Figure 23D:
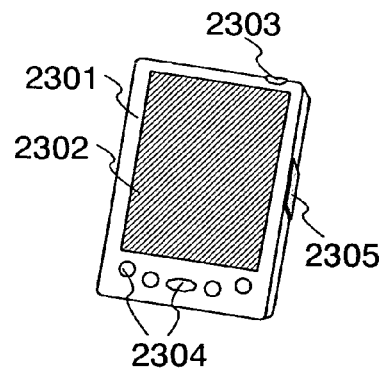

FIG. 23D shows a mobile computer that includes a main body 2301, a display portion 2302, a switch 2303, operating keys 2304, an infrared port 2305, and the like. The mobile computer can be manufactured by applying the display device of this embodiment to the display portion 2302.

Figure 23E:
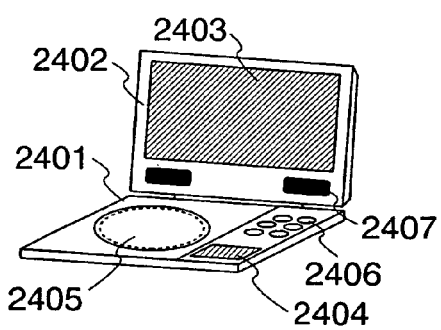

FIG. 23E shows a portable image reproducing device provided with a recording medium (such as a DVD reproducing device), which includes a main body 2401, a housing 2402, a display portion A 2403, a display portion B 2404, a recording medium (such as a DVD) reading portion 2405, an operating key 2406, a speaker portion 2407, and the like. The display portion A 2403 mainly displays image data while the display portion B 2404 mainly displays text data. The image reproducing device can be manufactured by applying the display device of this embodiment to the display portion A 2403 and the display portion B 2404. Note that the image reproducing device provided with a recording medium includes a game machine, and the like.

Figure 23F:
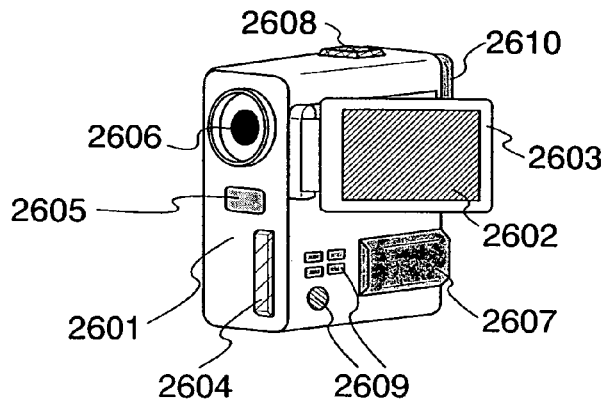

FIG. 23F shows a video camera that includes a main body 2601, a display portion 2602, a housing 2603, an external connecting port 2604, a remote control receiving portion 2605, an image receiving portion 2606, a battery 2607, a sound input portion 2608, operating keys 2609, an eyepiece portion 2610, and the like. The video camera can be manufactured by applying the display device of this embodiment to the display portion 2602.

Figure 23G:
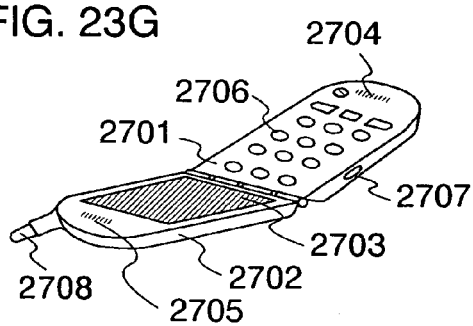

FIG. 23G shows a mobile phone that includes a main body 2701, a housing 2702, a display portion 2703, a sound input portion 2704, a sound output portion 2705, an operating key 2706, an external connecting port 2707, an antenna 2708, and the like. The mobile phone can be manufactured by applying the display device of this embodiment to the display portion 2703.

In addition, the integrated circuit device of the invention can have flexibility by reducing the thickness of a substrate over which an integrated circuit is formed. Specific examples of a flexible display device having a pixel portion are described below with reference to drawings.

Figure 24A:
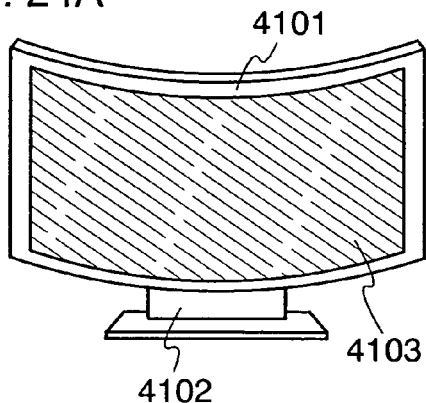
FIGS. 24A to 24F show electronic apparatuses each having a display portion to which the integrated circuit device of the invention is applied.

FIG. 24A shows a display that includes a main body 4101, a supporting base 4102, a display portion 4103, and the like. The display portion 4103 is formed using a flexible substrate to achieve a lightweight and thin display. The display portion 4103 can be curved and detached from the supporting base 4102 so that the display is mounted along a curved wall. Thus, the flexible display can be provided over a curved surface as well as a flat surface; therefore, it can be used for various applications. Since the thinning treatment is applied to a substrate over which an integrated circuit is formed, when the thickness of the substrate is reduced to 100 μm or less in the thinning treatment, the integrated circuit device of the invention can have flexibility. Accordingly, when the flexible integrated circuit device is used for a peripheral driver circuit for driving the display portion 4103, and the like, a flexible display can be manufactured.

Figure 24B:
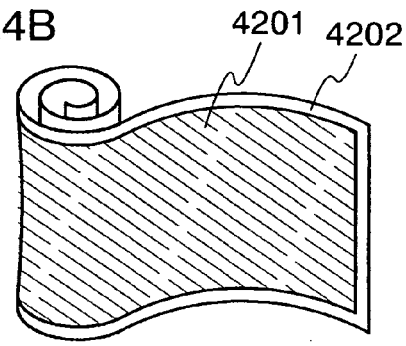

FIG. 24B shows a display that can be wound, which includes a main body 4201, a display portion 4202, and the like. The main body 4201 and the display portion 4202 are formed using a flexible substrate to carry the display in a bent or wound state. Therefore, even if the display is large-size, the display can be carried in a bag in a bent or wound state. Since the thinning treatment is applied to a substrate over which an integrated circuit is formed, when the thickness of the substrate is reduced to 100 µm or less in the thinning treatment, the integrated circuit device of the invention can have flexibility. Accordingly, when the flexible integrated circuit device is used for a peripheral driver circuit for driving the display portion 4202, and the like, a lightweight, thin, and large-size display can be manufactured.

Figure 24C:
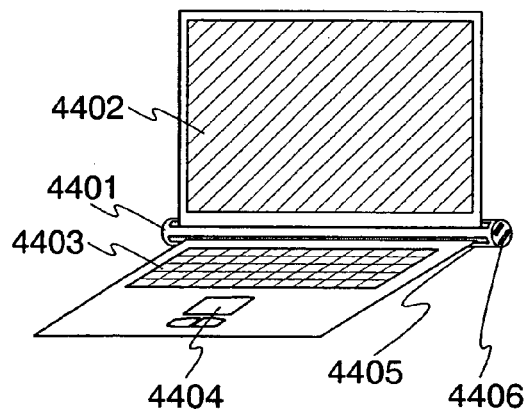

FIG. 24C shows a sheet computer that includes a main body 4401, a display portion 4402, a keyboard 4403, a touch pad 4404, an external connecting port 4405, a power supply plug 4406, and the like. The display portion 4402 is formed using a flexible substrate to achieve a lightweight and thin computer. In addition, the display portion 4402 can be wound and stored in the main body if a portion of the main body 4401 is provided with a storage space. In addition, when the keyboard 4403 is also formed to be flexible, the keyboard 4403 can be wound and stored in the storage space of the main body 4401 similarly to the display portion 4402, which is convenient for carrying around. The computer can be bent and stored without occupying space when it is not used. Since the thinning treatment is applied to a substrate over which an integrated circuit is formed, when the thickness of the substrate is reduced to 100 µm or less in the thinning treatment, the integrated circuit device of the invention can have flexibility. Accordingly, when the flexible integrated circuit device is used for a peripheral driver circuit for driving the display portion 4402, and the like, a lightweight and thin computer can be manufactured.

Figure 24D:
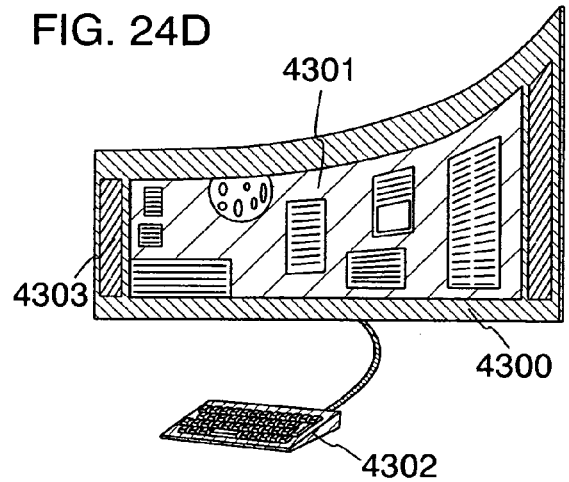

FIG. 24D shows a display device having a large display portion with a size of 20 to 80 inches, which includes a main body 4300, a keyboard 4302 that is an operating portion, a display portion 4301, a speaker 4303, and the like. The display portion 4301 is formed using a flexible substrate, and the main body 4300 can be carried in a bent or wound state with the keyboard 4302 detached. In addition, the connection between the keyboard 4302 and the display portion 4301 can be performed without wires. For example, the main body 4300 can be mounted along a curved wall and can be operated with the keyboard 4302 without wires. Since the thinning treatment is applied to a substrate over which an integrated circuit is formed, when the thickness of the substrate is reduced to 100 µm or less in the thinning treatment, the integrated circuit device of the invention can have flexibility. Accordingly, when the flexible integrated circuit device is used for a peripheral driver circuit for driving the display portion 4301, and the like, a lightweight, thin, and large-size display device can be manufactured.

Figure 24E:
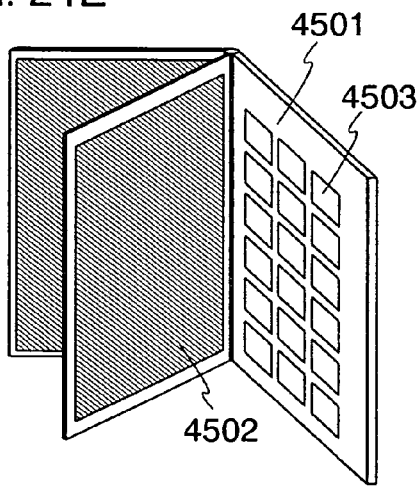

FIG. 24E shows an electronic book that includes a main body 4501, a display portion 4502, an operating key 4503, and the like. A modem may be incorporated in the main body 4501. The display portion 4502 is formed using a flexible substrate to be bent or wound. Therefore, the electronic book can also be carried without occupying space. Further, the display portion 4502 can display a moving image as well as a still image such as a character. Since the thinning treatment is applied to a substrate over which an integrated circuit is formed, when the thickness of the substrate is reduced to 100 µm or less in the thinning treatment, the integrated circuit device of the invention can have flexibility. Accordingly, when the flexible integrated circuit device is used for a peripheral driver circuit for driving the display portion 4502, and the like, a lightweight and thin electronic book can be manufactured.

Figure 24F:
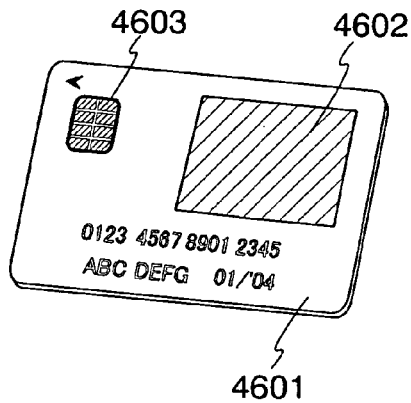

FIG. 24F shows an IC card that includes a main body 4601, a display portion 4602, a connecting terminal 4603, and the like. Since the display portion 4602 is formed using a flexible substrate to be a lightweight and thin sheet type, it can be attached onto a card surface. When the IC card can receive data in a non-contact manner, information obtained from outside can be displayed on the display portion 4602. Since the thinning treatment is applied to a substrate over which an integrated circuit is formed, when the thickness of the substrate is reduced to 100 µm or less in the thinning treatment, the integrated circuit device of the invention can have flexibility. Accordingly, when the flexible integrated circuit device is used for a peripheral driver circuit for driving the display portion 4602, and the like, a lightweight and thin IC card can be manufactured.

As set forth above, the applicable range of the invention is so wide that the invention can be applied to electronic apparatuses and information displaying means of various fields. Note that this embodiment can be freely combined with the above embodiment modes and embodiments.

Embodiment 3

Described in this embodiment is a case in which the integrated circuit device of the invention is applied to an IC card.

Figure 19A:
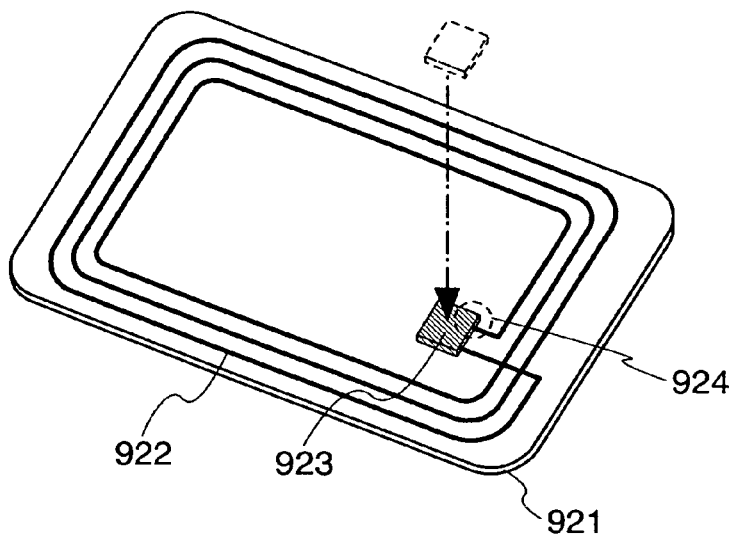
FIGS. 19A and 19B are perspective views and FIGS. 19C and 19D are cross sectional views showing Embodiment 3.

FIG. 19A is a top view of an IC card using the integrated circuit device of the invention. An integrated circuit device 923 of the invention is attached onto a substrate 921. Specifically, an element such as a thin film transistor included in the integrated circuit device 923 is electrically connected to a conductive film 922 functioning as an antenna, which is provided over the substrate 921.

Figure 19B:
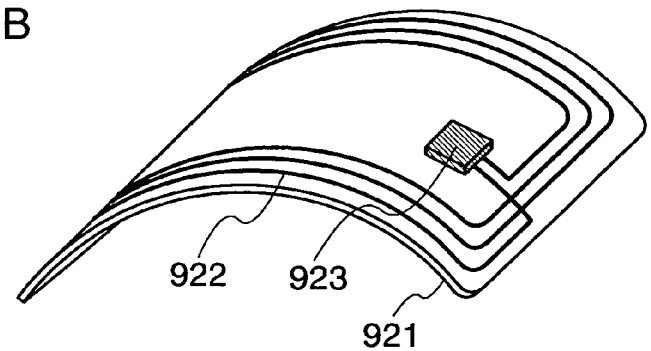
Figure 19C:
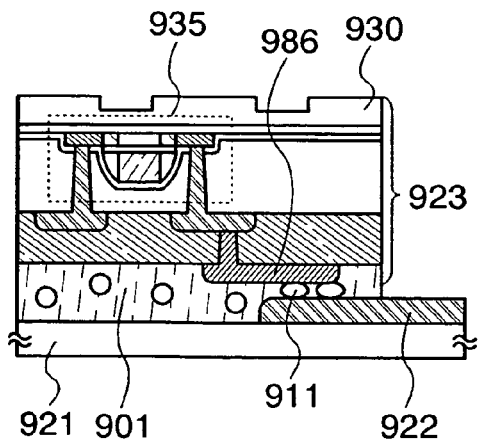

FIG. 19C is a cross sectional view of a part 924 in which the integrated circuit device 923 is electrically connected to the conductive film 922 functioning as an antenna. In the integrated circuit device 923, a thin film transistor 935 constituting an integrated circuit is formed over a surface of a substrate 930, and a groove as a depressed portion is formed on a surface of the substrate 930, over which the integrated circuit is not formed (hereinafter referred to as the other surface of the substrate 930). An electrode 986 that is electrically connected to the thin film transistor 935 is electrically connected to the conductive film 922 functioning as an antenna through a conductive particle 911 contained in an anisotropic conductive adhesive 901. As the anisotropic conductive adhesive 901, for example, an anisotropic conductive paste (ACP) or the like can be given. Alternatively, the electrode 986 and the conductive film 922 functioning as an antenna may be electrically connected to each other not only with the anisotropic conductive adhesive 901, but also with a conductive adhesive such as silver paste, copper paste, and carbon paste, a conductive film such as an anisotropic conductive film (ACF), a non-conductive paste (NCP), solder joint, or the like.

Figure 19D:
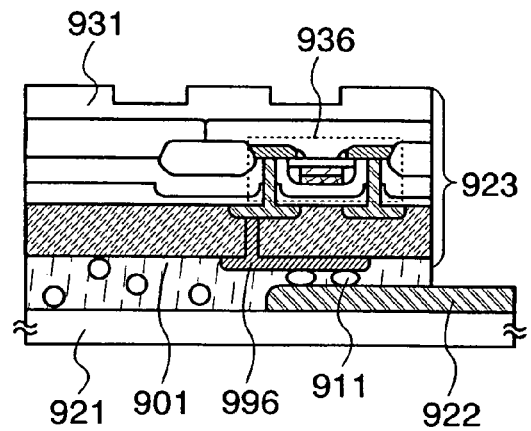

The transistor provided in the integrated circuit device is not limited to the thin film transistor shown in FIG. 19C, and may be a transistor formed over a semiconductor substrate such as a Si substrate, which uses the semiconductor substrate as a channel region. FIG. 19D is a cross sectional view in such a case. In the integrated circuit device 923, a transistor 936 is formed over a surface of a semiconductor substrate 931 such as a Si substrate, which uses the semiconductor substrate 931 as a channel region, and a groove as a depressed portion is formed on the other surface of the semiconductor substrate 931 (a surface of the semiconductor substrate 931, over which the transistor 936 is not formed). An electrode 996 that is electrically connected to the transistor 936 is electrically connected to the conductive film 922 functioning as an antenna through the conductive particle 911 contained in the anisotropic conductive adhesive 901. In that case, similarly to FIG. 19C, the electrode 996 and the conductive film 922 functioning as an antenna may be electrically connected to each other using other means than the anisotropic conductive adhesive 901.

Since the thinning treatment is applied to a substrate over which an integrated circuit is formed, when the thickness of the substrate is reduced to 100 μm or less in the thinning treatment, the integrated circuit device of the invention can have flexibility. Accordingly, when a flexible substrate such as a plastic substrate is used as the substrate 921 and the flexible integrated circuit device of the invention is provided over the flexible substrate 921, the IC card can also be curved, leading to an IC card with an added value (FIG. 19B).

Embodiment 4

Described in this embodiment is a case in which the integrated circuit device of the invention is applied to a semiconductor device that is capable of transmitting and receiving data in a non-contact manner (also called an RFID (Radio Frequency Identification) tag, an ID tag, an IC tag, an IC chip, an RF (Radio Frequency) tag, a wireless tag, an electronic tag, or a wireless chip).

Figure 20A:
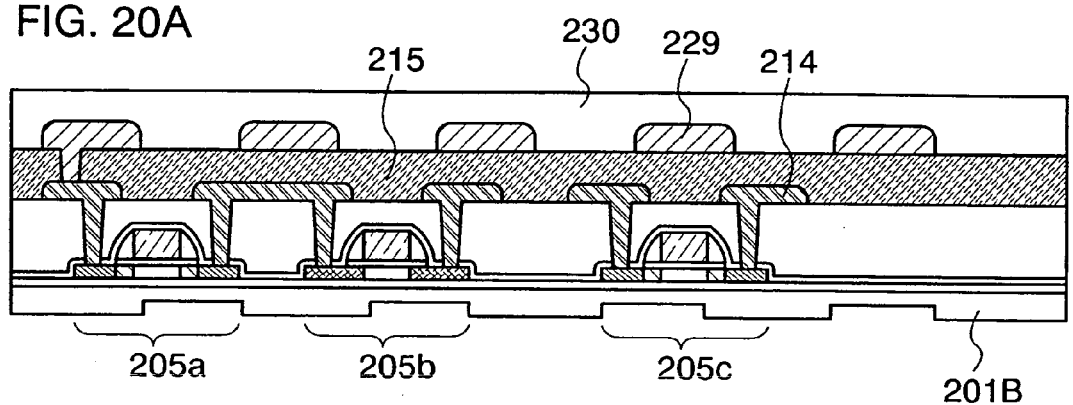
FIGS. 20A and 20B are cross sectional views showing Embodiment 4.

In the manufacturing method described in Embodiment Mode 2, an integrated circuit device is manufactured with reference to FIGS. 4A to 5A in a similar manner to Embodiment Mode 2. Then, in FIG. 5B, instead of forming the electrode 216, a conductive film 229 functioning as an antenna is formed over the insulating film 215 so as to be electrically connected to at least one of the thin film transistors 205a to 205c. Subsequently, an insulating film 230 functioning as a protective film is formed to cover the conductive film 229 functioning as an antenna, and the first substrate 201A is subjected to the thinning treatment (namely, the same manufacturing method as that described in Embodiment Mode 2 is used in FIG. 5C or later). As a result, such an integrated circuit device as shown in FIG. 20A, which is capable of transmitting and receiving data in a non-contact manner can be manufactured. Note that when the thickness of the first substrate 201B after the thinning treatment is reduced to 100 μm or less, the integrated circuit device can have flexibility. Thus, a flexible integrated circuit device that is capable of transmitting and receiving data in a non-contact manner can be manufactured.

The conductive film 229 functioning as an antenna is formed by CVD, sputtering, a printing method such as screen printing and gravure printing, droplet discharging, a dispenser method, or the like using a conductive material. The conductive material is an element selected from aluminum (Al), titanium (Ti), silver (Ag), copper (Cu), gold (Au), and nickel (Ni), or an alloy material or a compound material mainly containing these elements, and a single layer structure or a stacked layer structure may be adopted.

The insulating film 230 may be formed by CVD, sputtering, or the like to have a single layer structure or a stacked layer structure of an insulating film containing oxygen or nitrogen, such as a silicon oxide film, a silicon nitride film, a silicon oxynitride ($SiO_xN_y$) ($x>y>0$) film, and a silicon nitride oxide ($SiN_xO_y$) ($x>y>0$) film, or a film containing carbon such as DLC (Diamond Like Carbon). The insulating film 230 may also be formed by spin coating, screen printing, droplet discharging, or the like to have a single layer structure or a stacked layer structure of a film made of an organic material such as epoxy, polyimide, polyamide, polyvinylphenol, benzocyclobutene, and acrylic, or a siloxane material such as siloxane resin.

Figure 20B:
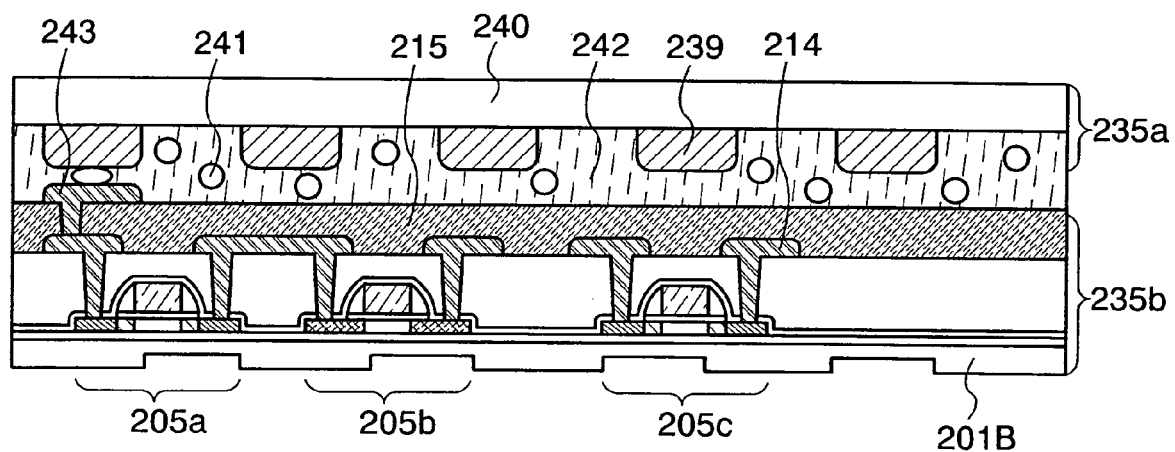

Alternatively, the conductive film 229 functioning as an antenna may be formed separately from the integrated circuit and then electrically connected to the integrated circuit. For example, in the manufacturing method described in Embodiment Mode 2, an integrated circuit device is manufactured from FIGS. 4A to 5A in a similar manner to Embodiment Mode 2. Then, in FIG. 5B, instead of forming the electrode 216 that is electrically connected to the thin film transistor 205c of the integrated circuit, an electrode 243 that is electrically connected to the thin film transistor 205a is formed. Subsequently, a conductive film 239 functioning as an antenna, which is formed over a substrate 240, and the integrated circuit including the thin film transistor and the like, which is formed over the first substrate 201A are attached so as to be electrically connected to each other. Then, a groove is formed on the first substrate 201A and the first substrate 201A is subjected to the thinning treatment, thereby manufacturing such an integrated circuit device as shown in FIG. 20B, which is capable of transmitting and receiving data in a non-contact manner. Note that when the thickness of the first substrate 201B after the thinning treatment is reduced to 100 μm or less, the integrated circuit device can have flexibility. Thus, a flexible integrated circuit device that is capable of transmitting and receiving data in a non-contact manner can be manufactured.

The substrate 240 may be made of a flexible material such as plastic, or the first substrate 201A and the substrate 240 may be attached to each other and subjected to the thinning treatment. In the latter case, the substrate 240 can be made of a similar material to the first substrate 201A. A layer 235a including the substrate 240 provided with the conductive film 229 functioning as an antenna and a layer 235b including the integrated circuit such as a transistor formed over the first substrate 201B can be attached to each other with an anisotropic conductive adhesive 242. The electrode 214 and the conductive film 229 functioning as an antenna can be electrically connected to each other through a conductive particle 241 contained in the anisotropic conductive adhesive 242. As the anisotropic conductive adhesive 242, for example, an anisotropic conductive paste (ACP) or the like can be given. Alternatively, the electrode 214 and the conductive film 229 functioning as an antenna may be electrically connected to each other with a conductive adhesive such as silver paste, copper paste, and carbon paste, a conductive adhesive such as ACP, a conductive film such as an ACF, an NCP, solder joint, or the like.

As a signal transmission system in the aforementioned integrated circuit device that is capable of transmitting and receiving data in a non-contact manner, an electromagnetic coupling system, an electromagnetic induction system, a microwave system, or the like can be used. The transmission system may be appropriately selected by a practitioner in consideration of an intended use, and an optimum antenna may be provided in accordance with the transmission system.

For example, if an electromagnetic coupling system or an electromagnetic induction system (e.g., 13.56 MHz band) is used as the signal transmission system in the integrated circuit device, electromagnetic induction caused by a change in magnetic field density is utilized. Therefore, the conductive film functioning as an antenna is formed into an annular shape (e.g., a loop antenna) or a spiral shape (e.g., a spiral antenna).

If a microwave system (e.g., UHF band (860 to 960 MHz band), 2.45 GHz band, or the like) is used as the signal transmission system in the integrated circuit device, the shape such as the length of the conductive film functioning as an antenna may be appropriately set in consideration of the wavelength of an electromagnetic wave used for signal transmission. For example, the conductive film functioning as an antenna can be formed into a linear shape, a flat shape, a ribbon shape, or the like. The shape of the conductive film functioning as an antenna is not limited to a linear shape, and the conductive film functioning as an antenna may be provided in a curved line, a meander shape, or a combination thereof, in consideration of the wavelength of an electromagnetic wave.

Figure 25A:
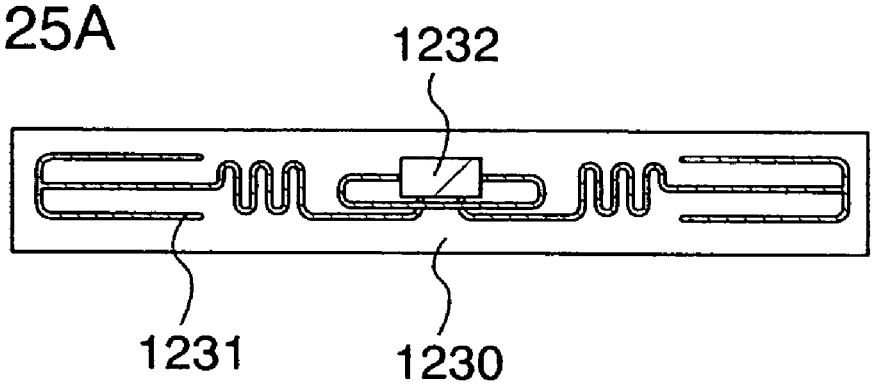
FIGS. 25A to 25C show examples of an antenna shape.

FIG. 25A shows an example of a conductive film functioning as an antenna, which is formed into a linear shape. In FIG. 25A, an integrated circuit device 1232 is attached to a substrate 1230 over which a conductive film (dipole antenna) 1231 functioning as an antenna is formed.

Figure 25B:
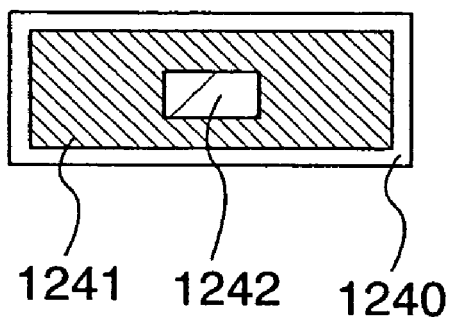

FIG. 25B shows an example of a conductive film functioning as an antenna, which is formed into a flat shape. In FIG. 25B, an integrated circuit device 1242 is attached to a substrate 1240 over which a conductive film (patch antenna) 1241 functioning as an antenna is formed.

Figure 25C:
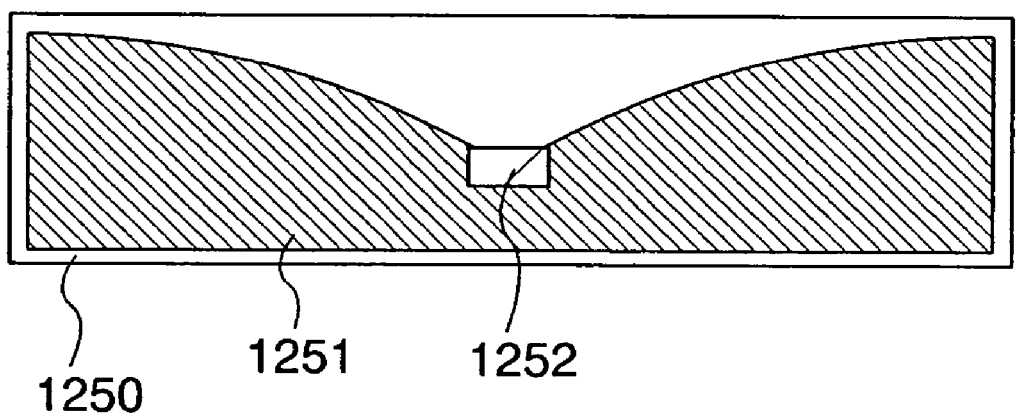

FIG. 25C shows an example of a conductive film functioning as an antenna, which is formed into a ribbon shape. In FIG. 25C, an integrated circuit device 1252 is attached to a substrate 1250 over which a conductive film 1251 functioning as an antenna is formed.

This application is based on Japanese Patent Application serial No. 2005-254481 filed in Japan Patent Office on Sep. 2, 2005, the entire contents of which are hereby incorporated by reference.

What is claimed is:

1. An integrated circuit device comprising:
a substrate;
an integrated circuit formed over one surface of the substrate; and
a plurality of depressed portions formed at the other surface of the substrate,
wherein the other surface has a larger surface area than the one surface,
wherein the plurality of depressed portions contains a heat sink material,
wherein the plurality of depressed portions does not penetrate through the substrate,
wherein the integrated circuit comprises a thin film transistor,
wherein the plurality of depressed portions has a U shape, and
wherein the substrate remains at a bottom of the plurality of depressed portions.

2. An integrated circuit device comprising:
a plurality of substrates stacked with each other;
an integrated circuit formed over one surface of each of the plurality of substrates; and
a plurality of depressed portions formed at the other surface of each of the plurality of substrates,
wherein the other surface has a larger surface area than the one surface,
wherein the plurality of depressed portions contains a heat sink material,
wherein a thickness of the plurality of substrates is 100 µm or less,
wherein the plurality of depressed portions does not penetrate through the substrate,
wherein the integrated circuit comprises a thin film transistor,
wherein the plurality of depressed portions has a U shape, and
wherein the substrate remains at a bottom of the plurality of depressed portions.

3. An integrated circuit device comprising:
a substrate;
an integrated circuit formed over one surface of the substrate; and
a plurality of depressed portions formed at the other surface of the substrate,
wherein the other surface has a larger surface area than the one surface, and
wherein a film containing a heat sink material is formed over at least surfaces of the plurality of depressed portions,
wherein the plurality of depressed portions does not penetrate through the substrate,
wherein the integrated circuit comprises a thin film transistor,
wherein the plurality of depressed portions has a U shape, and
wherein the substrate remains at a bottom of the plurality of depressed portions.

4. An integrated circuit device comprising:
a plurality of substrates stacked with each other;
an integrated circuit formed over one surface of each of the plurality of substrates; and
a plurality of depressed portions formed at the other surface of each of the plurality of substrates,
wherein the other surface has a larger surface area than the one surface,
wherein a film containing a heat sink material is formed over at least surfaces of the depressed portions,
wherein a thickness of the plurality of substrates is 100 µm or less,
wherein the plurality of depressed portions does not penetrate through the substrate,
wherein the integrated circuit comprises a thin film transistor,
wherein the plurality of depressed portions has a U shape, and
wherein the substrate remains at a bottom of the plurality of depressed portions.

5. An integrated circuit device comprising:
a plurality of substrates stacked with each other;
an integrated circuit formed over one surface of each of the plurality of substrates; and
a plurality of depressed portions formed at the other surface of each of the plurality of substrates,
wherein the other surface has a larger surface area than the one surface,
wherein the plurality of depressed portions contains a heat sink material,
wherein each of the plurality of substrates includes a heat dissipation portion,
wherein a thickness of the plurality of substrates is 100 µm or less,
wherein the plurality of depressed portions does not penetrate through the substrate,
wherein the integrated circuit comprises a thin film transistor,
wherein the plurality of depressed portions has a U shape, and wherein the substrate remains at a bottom of the plurality of depressed portions.

6. An integrated circuit device comprising:
a plurality of substrates stacked with each other;
an integrated circuit formed over one surface of each of the plurality of substrates; and
a plurality of depressed portions formed at the other surface of each of the plurality of substrates,
wherein the other surface has a larger surface area than the one surface,
wherein a film containing a heat sink material is formed over at least surfaces of the depressed portions,
wherein each of the plurality of substrates includes a heat dissipation portion,
wherein a thickness of the plurality of substrates is 100 μm or less,
wherein the plurality of depressed portions does not penetrate through the substrate,
wherein the integrated circuit comprises a thin film transistor,
wherein the plurality of depressed portions has a U shape, and
wherein the substrate remains at a bottom of the plurality of depressed portions.

7. An integrated circuit device comprising:
a plurality of substrates stacked with each other;
an integrated circuit formed over one surface of each of the plurality of substrates; and
a plurality of depressed portions formed at the other surface of each of the plurality of substrates,
wherein the other surface has a larger surface area than the one surface,
wherein the plurality of depressed portions contains a heat sink material,
wherein a part of the plurality of substrates includes a heat dissipation portion,
wherein a thickness of the plurality of substrates is 100 μm or less,
wherein the plurality of depressed portions does not penetrate through the substrate,
wherein the integrated circuit comprises a thin film transistor,
wherein the plurality of depressed portions has a U shape, and
wherein the substrate remains at a bottom of the plurality of depressed portions.

8. An integrated circuit device comprising:
a plurality of substrates stacked with each other;
an integrated circuit formed over one surface of each of the plurality of substrates; and
a plurality of depressed portions formed at the other surface of each of the plurality of substrates,
wherein the other surface has a larger surface area than the one surface,
wherein a film containing a heat sink material is formed over at least surfaces of the depressed portion,
wherein a part of the plurality of substrates includes a heat dissipation portion,
wherein a thickness of the plurality of substrates is 100 μm or less,
wherein the plurality of depressed portions does not penetrate through the substrate,
wherein the integrated circuit comprises a thin film transistor,
wherein the heat sink material is formed of a material in which a metal is mixed with polymer, and
wherein the substrate remains at a bottom of the plurality of depressed portions.

9. The integrated circuit device according to any one of claim 1 to 8, wherein the heat sink material has a higher thermal conductivity than the substrate.

10. The integrated circuit device according to any one of claims 1 to 8, wherein the substrate is one of a glass substrate and a quartz substrate, and wherein the heat sink material has a thermal conductivity of 2 W/(m·K) or more at 20° C.

11. The integrated circuit device according to any one of claim 1 to 8, wherein the substrate is one of a glass substrate and a quartz substrate, and wherein the heat sink material has a thermal conductivity of 10 W/(m·K) or more at 20° C.

12. The integrated circuit device according to any one of claims 1 to 8, wherein the substrate is one of a glass substrate and a quartz substrate, and wherein the heat sink material has a thermal conductivity of 100 W/(m·K) or more at 20° C.

13. The integrated circuit device according to any one of claim 1 to 8, wherein the substrate is a Si substrate, and wherein the heat sink material has a thermal conductivity of 150 W/(m·K) or more at 20° C.

14. The integrated circuit device according to any one of claim 1 to 8, wherein the substrate is a Si substrate, and wherein the heat sink material has a thermal conductivity of 200 W/(m·K) or more at 20° C.

15. The integrated circuit device according to claim 1, wherein the substrate has a thickness of 100 μm or less.

16. The integrated circuit device according to any one of claims 1 to 8, wherein the integrated circuit device is incorporated in one selected from the group consisting of a television receiver, a digital camera, a video camera, a computer, a mobile telephone, an image reproducing device, an electronic book, and an IC card.

17. The integrated circuit device according to claim 3, wherein the substrate has a thickness of 100 μm or less.

18. The integrated circuit device according to any one of claims 1 to 8, wherein the thin film transistor comprises an amorphous semiconductor film or a polycrystalline semiconductor film.

19. The integrated circuit device according to claim 8, wherein the metal is any one selected from magnesium, aluminum, duralumin, iron, nickel, zinc, tin, copper, or an alloy thereof.

* * * * *